(12) United States Patent
Taylor

(10) Patent No.: US 7,385,230 B1
(45) Date of Patent: *Jun. 10, 2008

(54) MODULATION DOPED THYRISTOR AND COMPLEMENTARY TRANSISTOR COMBINATION FOR A MONOLITHIC OPTOELECTRONIC INTEGRATED CIRCUIT

(75) Inventor: Geoff W. Taylor, Storrs-Mansfield, CT (US)

(73) Assignees: The University of Connecticut, Farmington, CT (US); Opel, Inc., Shelton, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/053,350

(22) Filed: Feb. 8, 2005

(51) Int. Cl.
    *H01L 29/74* (2006.01)
(52) U.S. Cl. ............... 257/107; 257/115; 257/157; 257/E27.052
(58) Field of Classification Search .......... 257/12, 257/192, 14, 194–195, 197–198, 20, 24, 257/108, 110, 172, 107, 115, 157
See application file for complete search history.

(56) References Cited

U.S. PATENT DOCUMENTS

| | | | |
|---|---|---|---|
| 3,919,656 A | 11/1975 | Sokal et al. .......... 330/51 |
| 4,424,525 A | 1/1984 | Mimura .......... 357/23 |
| 4,658,403 A | 4/1987 | Takiguchi et al. .......... 372/96 |
| 4,683,484 A | 7/1987 | Derkits, Jr. .......... 357/16 |
| 4,806,997 A | 2/1989 | Simmons et al. .......... 357/16 |
| 4,807,008 A * | 2/1989 | Chang et al. .......... 257/107 |
| 4,814,774 A | 3/1989 | Herczfeld .......... 432/372 |
| 4,827,320 A | 5/1989 | Morkoc et al. .......... 357/22 |
| 4,829,272 A | 5/1989 | Kameya .......... 333/139 |
| 4,899,200 A | 2/1990 | Shur et al. .......... 357/30 |
| 4,949,350 A | 8/1990 | Jewell et al. .......... 372/45 |
| 5,010,374 A | 4/1991 | Cooke et al. .......... 357/16 |
| 5,099,299 A | 3/1992 | Fang .......... 257/26 |
| 5,105,248 A | 4/1992 | Burke et al. .......... 357/24 |
| 5,111,255 A | 5/1992 | Kiely et al. .......... 372/45 |
| 5,202,896 A | 4/1993 | Taylor .......... 372/50 |
| 5,204,871 A | 4/1993 | Larkins .......... 372/45.1 |

(Continued)

OTHER PUBLICATIONS

*10-Gb/s High-Speed Monolithically Integrated Photoreceiver Using InGaAs p-l-n PD and Planar Doped InAlAs/InGaAs HEMT's* by Y. Akahori et al., IEEE Photonics Technology Letters, vol. 4, No. 7, Jul. 1992.

(Continued)

*Primary Examiner*—Wai-Sing Louie
(74) *Attorney, Agent, or Firm*—Gordon & Jacobson, PC

(57) ABSTRACT

A thyristor and family of high speed transistors and optoelectronic devices are obtained on a monolithic substrate (149) with an epitaxial layer structure comprised of two modulation doped transistor structures inverted with respect to each other. The transistor structures are obtained by adding planar doping to the Pseudomorphic High Electron Mobility Transistor (PHEMT) structure. For one transistor, two sheets of planar doping of the same polarity separated by a lightly doped layer are added which are opposite to the modulation doping of the PHEMT. The combination is separated from the PHEMT modulation doping by undoped material. The charge sheets are thin and highly doped. The top charge sheet (168) achieves low gate contact resistance and the bottom charge sheet (153) defines the capacitance of the field-effect transistor (FET) with respect to the modulation doping layer of the PHEMT. For the other transistor, only one additional sheet is added.

23 Claims, 15 Drawing Sheets

U.S. PATENT DOCUMENTS

| | | | |
|---|---|---|---|
| 5,224,115 A | 6/1993 | Taylor et al. | 372/50 |
| 5,278,427 A | 1/1994 | Choi | 257/17 |
| 5,337,328 A | 8/1994 | Lang et al. | 372/45 |
| 5,349,599 A * | 9/1994 | Larkins | 372/50.21 |
| 5,386,128 A | 1/1995 | Fossum et al. | 257/183.1 |
| 5,422,501 A | 6/1995 | Bayraktaroglu | 257/195 |
| 5,436,759 A | 7/1995 | Dijaili et al. | 359/333 |
| 5,567,961 A * | 10/1996 | Usagawa et al. | 257/197 |
| 5,652,439 A | 7/1997 | Kuijk et al. | 257/113 |
| 5,677,552 A | 10/1997 | Ogura | 257/113 |
| 5,698,900 A | 12/1997 | Bozada et al. | 257/744 |
| 5,828,987 A | 10/1998 | Takahashi | 257/96 |
| 5,847,414 A | 12/1998 | Harris et al. | 257/77 |
| 5,892,786 A * | 4/1999 | Lott | 372/50.124 |
| 6,031,243 A * | 2/2000 | Taylor | 257/13 |
| 6,043,519 A | 3/2000 | Shealy et al. | 257/192 |
| 6,229,189 B1 | 5/2001 | Yap et al. | 257/414 |
| 6,320,212 B1 | 11/2001 | Chow | 257/197 |
| 6,451,659 B1 | 9/2002 | Delage et al. | 438/312 |
| 6,465,289 B1 | 10/2002 | Streit et al. | 438/167 |
| 6,479,844 B2 * | 11/2002 | Taylor | 257/192 |
| 6,545,340 B1 | 4/2003 | Higgs et al. | 257/565 |
| 6,583,455 B1 | 6/2003 | Micovic et al. | 257/200 |
| 6,597,011 B1 | 7/2003 | Atanackovic | 257/20 |
| 6,625,183 B1 | 9/2003 | Hand et al. | 372/20 |
| 6,697,405 B2 * | 2/2004 | Kitatani et al. | 372/45.01 |
| 6,765,242 B1 | 7/2004 | Chang et al. | 257/197 |
| 6,873,273 B2 * | 3/2005 | Taylor et al. | 341/137 |
| 6,905,900 B1 * | 6/2005 | Johnson et al. | 438/29 |
| 6,977,954 B2 * | 12/2005 | Taylor et al. | 372/50.21 |
| 2002/0067877 A1 | 6/2002 | Braun et al. | 385/15 |
| 2003/0020099 A1 | 1/2003 | Taylor | 257/215 |
| 2004/0081216 A1 | 4/2004 | Dehmubed | 372/50 |

OTHER PUBLICATIONS

*10-Gbit/s InP-Based High-Performance Monolithic Photoreceivers Consisting of p-i-n Photodiodes and HEMT's* by Kiyoto Takahata et al., IEICE Trans. Electron., vol. E83-C, No. 6, Jun. 2000.

*10 Ghz Bandwidth Monolithic p-i-n Modulation-Doped Field Effect Transistor Photoreceiver* by N.K. Dutta et al., Appl. Phys. Lett., vol. 63, No. 15, Oct. 11, 1993.

*20 Gbit/s Long Wavelenght Monolithic Integrated Photoreceiver Grown in GaAs* by V. Hurm et al., Electronic Letters, vol. 33, No. 7, Mar. 27, 1997.

*Heterojunction Field-Effect Transistor (HFET)* by G.W. Taylor et al., Electronics Letters, vol. 22, No. 15, pp. 784-786, Jul. 17, 1986.

*High Temperature Annealing of Modulation Doped GaAs/AlGaAs Heterostructures for FET Applications* by H. Lee et al., 1983 IEEE/Cornell Conf. On High-Speed Semiconductor Devices & Ckts, Aug. 1983.

*Monolithic Integrated Optoelectronic Circuits* by M. Berroth et al., 0-7803-2442-0-8/95 IEEE, 1995.

*Submicrometre Gate Length Scaling of Inversion Channel Heterojunction Field Effect Transistor* by P.A. Kiely et al., Electronics Letters, vol. 30, No. 6, Mar. 17, 1994.

*Theoretical and Experimental Results for the Inversion Channel Heterostructure Field Effect Transistor* by G.W. Taylor et al., IEE Proceedings-G, vol. 140, No. 6, Dec. 1993.

WO 02/071490 PCT; "A Modulation Doped Thyristor and Complementary Transistor Combination for a Monolithic Optoelectronic IntegratedCircuit"; Sep. 2002.

* cited by examiner

| Layer Material | Layer Doping | Typical Doping Strength | Typical Layer Thickness | |
|---|---|---|---|---|
| InGaAs | P+ | 1E20 | 25 | 165b |
| GaAs | P+ | 1E20 | 75 | 165a |
| Al(.7)Ga(.3)As | P | 1E17 | 700 | 164b |
| Al(.7)Ga(.3)As | P+ | 1E19 | 10 | 164a |
| Al(.15)Ga(.85)As | P+ | 3.5E18 | 80 | 163d |
| Al(.15)Ga(.85)As | | UD | 300 | 163c |
| Al(.15)Ga(.85)As | N+ | 3.5E18 | 80 | 163b |
| Al(.15)Ga(.85)As | | UD | 30 | 163a |
| GaAs | | UD | 15 | 162 |
| In(.20)Ga(.80)AsN QW/ GaAs QW } X3 | | UD | 60 | 161 |
| GaAs Barrier | | | | |
| GaAs | | UD | 100 | 160b |
| Al(.15)Ga(.85)As | | UD | 150 | 160a |
| GaAs | | UD | 5000 | 159 |
| GaAs Barrier | | UD | 100 | 158 |
| In(.20)Ga(.80)AsN QW/GaAs QW } X3 | | UD | 60 | 157 |
| GaAs | | UD | 15 | 156 |
| Al(.15)Ga(.85)As | | UD | 30 | 155d |
| Al(.15)Ga(.85)As | P+ | 3.5E18 | 80 | 155c |
| Al(.15)Ga(.85)As | | UD | 300 | 155b |
| Al(.15)Ga(.85)As | N+ | 3.5E18 | 80 | 155a |
| Al(.7)Ga(.3)As | N | 5E17 | 700 | 154 |
| GaAs | N+ | 3.5E18 | 2200 | 153 |
| AlAs | | UD | 1701 | 151 |
| GaAs (mirror x 7) | | UD | 696 | 152 |
| AlAs (mirror x 7) | | UD | 1701 | 151 |
| GaAs Substrate | | SI | | 149 |

FIG.1a

MODULATION DOPED THYRISTOR AND COMPLEMENTARY TRANSISTOR COMBINATION FOR A MONOLITHIC OPTOELECTRONIC INTEGRATED CIRCUIT

BACKGROUND OF THE INVENTION

1. Field of the Invention

This invention relates to the field of semiconductor heterojunction devices and, in particular to a semiconductor structure which utilizes an inversion channel created by modulation doping to implement thyristors, transistors, optical emitters, optical detectors, optical modulators, optical amplifiers and other opto-electronic devices.

2. State of the Art

This invention builds upon the existing device structure known as the Pseudomorphic Pulsed Doped High Electron Mobility Transistor (Pulsed Doped PHEMT) and sometimes referred to as the Pulsed Doped Modulation Doped Field Effect Transistor (Pulsed Doped MODFET) or the Pulsed Doped Two Dimensional Gas Field Effect Transistor(Pulsed Doped TEGFET). Ga/As/InGaAs/Al$_x$Ga$_{1-x}$As has been the III-V material system of choice for these devices because of the ability to grow high optical/electrical quality epitaxial layers by MBE (molecular beam epitaxy). However, relatively new wideband semiconductors such as GaN are also promising candidates since quantum wells are easily formed. PHEMTs are now in constant demand as the front end amplifier in wireless and MMIC applications and they have become well recognized for their superior low noise and high frequency performance.

The PHEMT has been very successful in producing microwave transistors that operate well into the multi-gigahertz regime, initially being used extensively in military systems and now finding their way into commercial products, particularly in the area of cellular communications. There are a multitude of advantages to be gained by the use of optical signals in conjunction with electrical signals in the high frequency regime. Combining electronic with optoelectronic components monolithically gives rise to the concept of the optoelectronic integrated circuit (OEIC). In general, monolithic integration has proven to be difficult because of the very dissimilar nature of the structures of electronic devices such as the FET on the one hand and the optoelectronic devices on the other hand such as the junction diode laser and the MSM or PIN diode. To make matters even more complicated, the introduction of optoelectronic device combinations must compete with state-of-the-art electronic chip technology which is currently complementary MOS transistors in the form of Si CMOS circuits. The implication is that the introduction of optoelectronic device combinations must provide for complementary device combinations together with optoelectronic functionality. In this way, an optoelectronic technology base would provide both complementary functions and optoelectronic functions which would provide it with a clear cut advantage over conventional CMOS. The PHEMT may be modified for optoelectronics by the use of an ohmic contact to replace the Schottky contact (see U.S. Pat. No. 4,800,415 which is hereby incorporated by reference herein in its entirety). Such a device has been designated an HFET or more precisely an inversion channel HFET (ICHFET) to distinguish it from the broad range of III-V transistors which have been described as HFETs. However, the detailed nature of how the p doping is added to the PHMET is a critical issue because the resulting structure must perform multiple functions which are 1) it must provide a low resistance ohmic contact, 2) it must provide funneling of carriers into the active region of the optoelectronic device, and 3) it must minimize the effects of free carrier absorption. In order to realize a complementary structure with an ohmic contact modified PHEMT, it is necessary to grow two different types of modulation doped quantum well interfaces, one which creates an inversion channel for electrons and one which creates an inversion channel for holes. The manner in which these two interfaces are combined structurally, affords some unique opportunities for the creation of optical switches in the form of thyristors. These are routinely formed in the implementation of CMOS technology as the series combination of p-n-p-n structures but are intentionally suppressed to eliminate parasitic latch-up. However in the design of the III-V complementary technology layer structure, the thyristor may be optimized to provide unique opportunities for switching lasers and detectors.

It is an object of this invention to devise a single epitaxial layer structure which can simultaneously within a single integrated circuit chip be fabricated to operate as an electron majority carrier bipolar transistor, a hole majority carrier bipolar transistor, a field-effect transistor with electrons as the channel majority carrier, a field-effect transistor with holes as the channel majority carrier, a laterally injected laser in which channel majority carriers are injected from channel contacts and channel minority carriers are injected from an ohmic gate contact, a thyristor switching laser, a thyristor switching detector which absorbs radiation across the bandgap of its quantum well(s), a pin type bandgap detector in which majority photoelectrons are removed to the channel contacts and photoholes are removed to the gate or collector ohmic contact, an optical amplifier and a modulator.

Another object of the invention is to specify a fabrication technology to produce a pair of complementary n-channel and p-channel field effect transistors that function optimally as a complementary logic gate. This fabrication sequence should also produce complementary bipolar field-effect transistors with n-channel and p-channel control elements respectively.

Another object of this invention is to show how the thyristor device may be optimized from the same complementary technology sequence to perform as a high efficiency laser when switched to its on state and as a high efficiency detector in its high impedance off state.

Another object of this invention is to produce an in-plane directional coupler using the complementary structure in which the propagation constants in two parallel waveguides may be altered selectively by the injection of charge into either or both of these guides from self-aligned contacts which may inject charge into the core of their respective waveguides.

Another objects of this invention is to show how the optoelectronic devices can be fabricated as vertical cavity devices and yet also provide sources, detectors, modulators, amplifiers and switches that are interconnected by low loss passive waveguides in the plane of the integrated circuit.

It is a further object of this invention to achieve these goals with a unique combination of planar sheet dopings which modify the generic PHEMT structure and provide it with optoelectronic capability.

A final object of this invention is to show how the complementary transistor technology and the optoelectronic device technology are optimized simultaneously for a manufacturable solution.

SUMMARY OF THE INVENTION

A semiconductor device structure and a fabrication technology have been invented to meet these objectives which achieves operation of vertical cavity as thyristor lasers and detectors together with complementary FET or bipolar operation using the same monolithic semiconductor device structure. In accordance with one illustrative embodiment of the invention, complementary ICHFET devices in which sheets of planar doping positioned very close to the modulation doped layers are used to establish the gate capacitance of the field-effect transistors (a p type sheet for the n channel transistor and an n type sheet for the p channel transistor) are combined epitaxialy to realize both transistors in a single epitaxial growth. Each of these transistors is the PHEMT device in which the gate contact is ohmic in nature as opposed to a Schottky diode. The ohmic contact is non-rectifying whereas the Schottky diode contact is rectifying to applied signals.

The n type transistor is grown with the gate contact above the quantum well (designated the normal configuration) and the p type transistor is grown with the gate contact below the quantum well (designated the inverted configuration). For the n type transistor, there are two planar sheet doping layers, between the gate metal and the modulation doped layer of the PHEMT and both of these are opposite doping type (p type) to the modulation doped layer (n type). The surface sheet charge enables a low resistance ohmic contact. The second sheet defines the input capacitance of the FET since it establishes the gate voltage at a precise spacing above the modulation doped layer. The spacing between these sheets of opposite doping types is undoped and formed in an intermediate band gap material relative to the quantum well.

The p type transistor is grown in the inverted configuration. The lowermost layer is the n type sheet which is spaced by the critical capacitor thickness below the p type modulation doped layer. Below this n type sheet is a layer of n+ type GaAs for the purpose of making an ohmic contact to the gate of the p type transistor. The ohmic contact to the bottom layer is made by conventional alloying techniques.

The collector contact of the n type transistor is formed by the channel region of the p type transistor and the collector contact of the p type transistor is formed by the channel region of the n type transistor. This is achieved by the combination of the normal and inverted devices within the same set of epitaxial layers. The thyristor is created by the complete layer structure, so that it encompasses both n type and p type transistors. The thyristor structure can make use of all of the terminal contacts of the n type and p type transistors.

To create the n type inversion channel devices, source and drain electrodes are formed on either side of a refractory metal gate/emitter using ion implantation and standard self-alignment techniques. The source and drain electrodes are metalized after a high temperature anneal which activates the implanted species. For the p type devices, the refractory metal defines the gate feature but actually performs as the collector of the device. The gate layer is the bottom N+ layer and its electrical connection is provided by an ohmic contact placed to one side of the source or drain regions to provide electrical access to the bottom epitaxial layer. For the field effect transistors, the gate or collector contact metal forms a uniform metal feature across the length (short dimension) of the device. For the optoelectronic devices (which includes the thyristor laser, detector, optical amplifier and modulator) the gate metal is opened to allow the passage of light either into or out of the active region and the surface P++ planar sheet doping is relied upon to produce a constant potential across the optical opening. Then the current flow from the gate metal contact into the active layer is two dimensional in nature with the contours of the carrier flow determined by the use of a Si implant to steer the carrier flow. The optoelectronic devices are resonant vertical cavity devices and the spacing between the modulation doped layers of the n and p type transistors is adjusted to produce an integral number of half wavelengths in the cavity.

The above embodiment produces optoelectronic devices that emit or detect normal to the surface. In another embodiment, the DBR mirrors of the vertical cavity perform as the cladding layers, for a dielectric waveguide, and the light is entered into the edge of the device by means of a passive waveguide fabricated monolithically with these devices. By the use of a grating etched into the waveguide, the light may be continuously converted from vertical cavity to waveguide propagation. This operation is particularly significant for the laser, detector, modulator and amplifier devices.

Advantages gained by the construction of the semiconductor device structure are that: the FET capacitance and position of gate voltage control and de-coupled from the doping used to achieve low gate contact resistance, the incidence of gate to source short circuits is greatly reduced, the effective (electrical) thickness of the gate dielectric can be made exceedingly thin, the sheets can be etched away to achieve low contact resistance, the threshold can be more easily adjusted by implant to obtain depletion devices, and manufacturability is much improved. The advantages obtained by the combination of the two transistors is that a new structure is formed which is the optoelectronic thyristor. The thyristor has unique properties of sensitive detection in its high impedance state and laser emission in its off state. The thyristor structure may be used as a digital modulation, a transceiver, an amplifier and a directional coupler. These devices may be realized as either waveguide or vertical cavity devices. The vertical cavity construction enables resonant cavity operation of all device modes. In addition to the multiple optoelectronic properties, the structure also produces inversion channel bipolar devices termed BICFETs having either electrons or holes as the majority carrier and heterostructure FETs with both electron and hole channels. Therefore complementary operation of FET or bipolar circuits is possible.

Further features and advantages of the invention will become more readily apparent from the following detailed description when taken in conjunction with the accompanying drawings.

BRIEF DESCRIPTION OF THE DRAWINGS

FIG. 1a is a schematic view showing layers of the structure according to the principle embodiment of the invention and from which the electronic and optoelectronic switching devices of the invention can be made.

FIG. 3 is an optical receiver circuit.

DESCRIPTION OF THE PREFERRED EMBODIMENTS

Figure 1B:
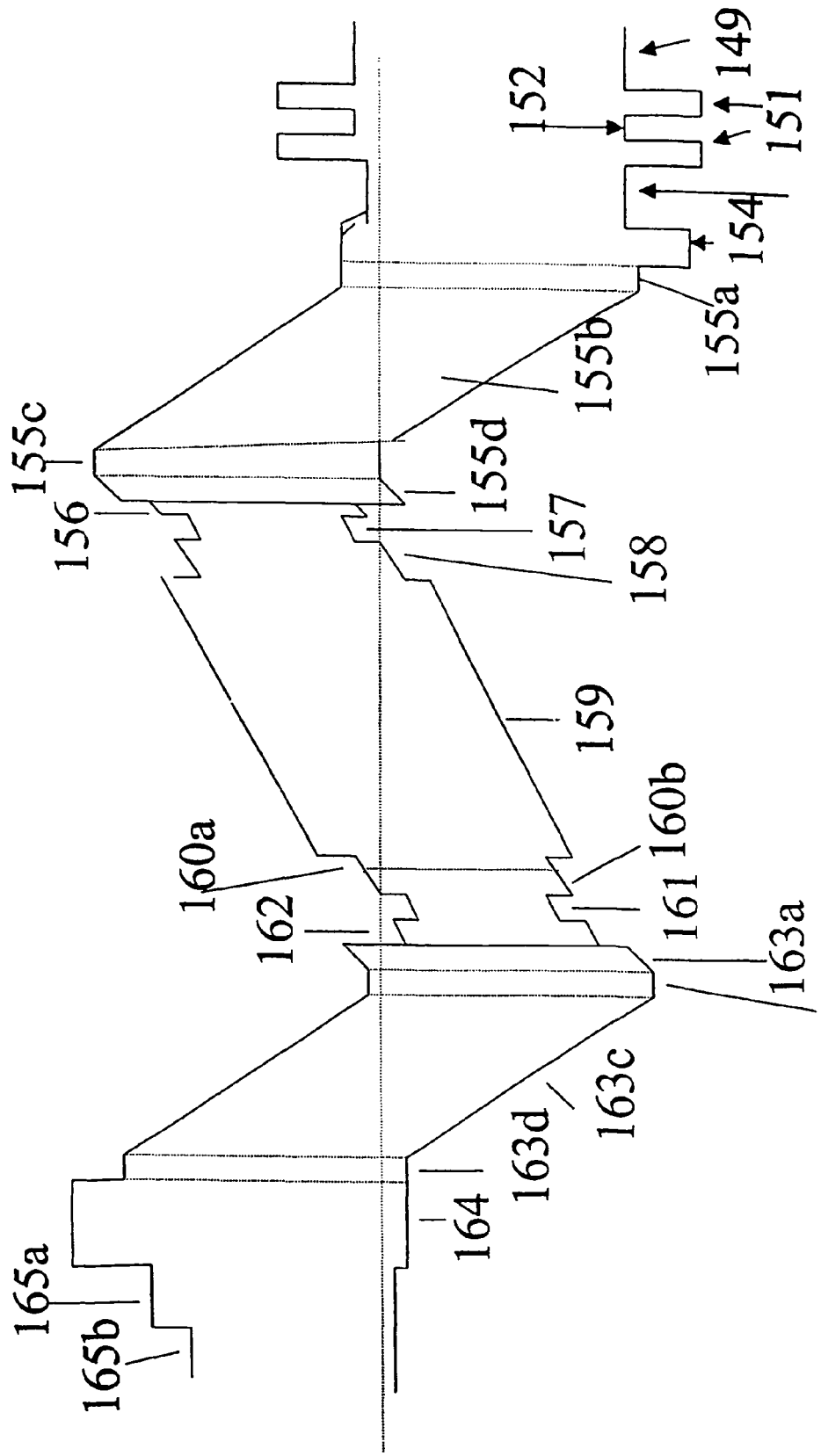
FIG. 1b shows the energy band diagram of the FIG. 1A structure.

FIG. 1a and FIG. 1b show the layers of a structure in accordance with an embodiment of the invention and from which all the device structures associated with the optoelectronic technology can be made. The structure of FIG. 1A can be made, for example, using known molecular beam epitaxy (MBE) techniques. A first semiconductor layer 151 of AlAs and a second semiconductor layer 152 of GaAs are deposited in pairs upon a semiinsulating gallium arsenide substrate 149 in sequence to form a dielectric distributed bragg reflector (DBR) mirror. The number of AlAs layers will preferably always be one greater than the number of GaAs layers so that the first and last layers of the mirror are shown as layer 151. In the preferred embodiment the AlAs layers will be subsequently subjected to high temperature steam oxidation to produce the compound $Al_xO_y$ so that a mirror will be formed at the designed center wavelength. Therefore the thicknesses of layers 151 and 152 in the mirror are chosen so that the final optical thickness of GaAs and $Al_xO_y$ are ¼ wavelength of the center wavelength $\lambda_D$. Deposited upon the mirror is the active device structure which consists of two HFET devices. The first of these is a p-channel HFET which has a p modulation doped quantum well and is positioned with the gate terminal on the lower side (i.e. on the mirror as just described) and the collector terminal on the upper side. The second of these is an n-channel HFET which has an n modulation doped quantum well and is positioned with the gate terminal on the top side and the collector terminal on the lower side which is the collector of the p-channel device. Therefore a non-inverted N-channel device is stacked upon an inverted p-channel device to form the active device structure.

The layer structure begins with layer 153 of heavily N+ doped GaAs of about 2000 Å thickness to enable the formation of ohmic contacts and this is the gate electrode of the p channel device. Deposited on layer 153 is layer 154 of N type $Al_xIGa_{1-x1}$As with a typical thickness of 500-3000 Å and a typical doping of $5 \times 10^{17}$ cm$^{-3}$. This layer serves as part of the PHFET gate and optically as the lower waveguide cladding layers for all laser, amplifier and modulator structures. The next layer 155 is $Al_{x2}Ga_{1-x2}$As of thickness about 380-500 Å and where x2 is about 15%. The first 60-80 Å (layer 155a) is doped N+ type in the form of delta doping, the next 200-300 Å (layer 155b) is undoped, the next 80 Å (layer 155c) is doped P+ type in the form of delta doping and the last 20-30 Å (layer 155d) is undoped to form a spacer layer. This layer forms the lower separate confinement heterostructure (SCH) layer for the laser, amplifier and modulator devices. The next layers define the quantum wells(s) of the PHFET. For a strained quantum well, this consists of a spacer layer 156 of about 10-25 Å of undoped GaAs and then combinations of a well of 40-80 Å (labeled 157) and a barrier of undoped GaAs (labeled 158). The well may be comprised of a range of compositions. In the preferred embodiment, the quantum well is formed from a $In_2Ga_{.8}AsN$ composition with the nitrogen content varying from 0% to 5% depending upon the desired natural emission frequency. Thus, for a natural emission frequency of 0.98 μm, the nitrogen content will be 0%; for a natural emission frequency of 1.3 μm, the nitrogen content will be approximately 2%; and for a natural emission frequency of 1.5 μm, the nitrogen content will be approximately 4-5%. The well barrier combination will typically be repeated three times. Unstrained quantum wells are also possible. Following the last barrier of undoped GaAs is a layer 159 of undoped $Al_{x2}Ga_{1-x2}$ which forms the collector of the PHFET device and is about 0.5 μm in thickness. All of the layers grown thus far form the PHFET device with the gate contact on the bottom.

Layer 159 also forms the collector region of the NHFET device. Deposited on 159 is a layer 160 of undoped GaAs of about 200-250 Å which forms the barrier of the first quantum well. This layer is wider than the normal barrier layer of about 100 Å because it accommodates the growth interruption to change the growth temperature from 610° C. (as required for optical quality $Al_{x2}Ga_{1-x2}As$ layers) to about 530° C. for the growth of InGaAs. Therefore layer 160 is divided into a single layer 160a of about 150 Å and a repeating barrier layer of about 100 Å. The next layer 161 is the quantum well of $In_{0.2}Ga_{0.8}As$ which is undoped and about 40-80 Å in thickness. It is noted that the quantum well layer 161 need not be of the same formulation as the quantum well layer 157. The barrier of 100 Å and quantum well of 40-80 Å may be repeated, e.g., three times. Then there is a barrier layer 162 of about 10-30 Å of undoped GaAs which accommodates a growth interruption and a change of growth temperature. Next there is a layer 163 of about 300-500 Å of $Al_{x2}Ga_{1-x2}As$. Layer 163 is comprised from bottom to top of an undoped spacer layer 163a of 20-30 Å of $Al_{x2}Ga_{1-x2}As$, a layer 163b of N+ type doping of about $3-5\times10^{18}$ cm$^{-3}$ which is a modulation doped layer, a capacitor spacing layer 163c of about 200-300 Å which is undoped and a P+ type delta doped layer 163d of about 60-80 Å and doping about $3-5\times10^{18}$ cm$^{-3}$ to form the top plate of the capacitor. The doping species for layer 163d is preferably carbon (C) to ensure diffusive stability. In contrast to layer 163b which is always depleted, layer 163d should never be totally depleted in operation. Layers 163d and 163b form the two plates of a parallel plate capacitor which forms the field-effect input to all devices. For the optoelectronic device operation, layer 163 is the upper SCH region. Layer 163 must be very thin to enable very high frequency operation. In the illustrated embodiment, for a transistor cutoff frequency of 40 GHz, a thickness of 300 Å would be used, and for 90 GHz a thickness of 200 Å would be more appropriate. Layer 164 of $Al_{x1}Ga_{1-x1}As$ is deposited next to form part of the upper waveguide cladding layer for the laser, amplifier and modulator devices. It has a typical thickness of 500-1500 Å. Layer 164 may have a first thin sublayer 164a of, e.g., 10-20 Å thickness and having a P+ typical doping of $10^{19}$ cm$^{-3}$. A second sublayer 164b has a P doping of $1-5\times10^{17}$ cm$^{-3}$ and a typical thickness of 700 Å. Deposited next is layer 165 of GaAs or a combination of GaAs and InGaAs which is about 50-100 Å thick and doped to a very high level of P+ type doping (about $1\times10^{20}$ cm$^{-3}$) to enable the best possible ohmic contact.

As described hereinafter, to form resonant cavity devices, a dielectric mirror is deposited on this structure during the fabrication process. The distance between the mirrors is the thickness of all layers from 153 to 165 inclusive. In designing this structure, this thickness must represent an integral number of ¼ wavelengths as the designated wavelength, and the thickness of layers 164 and/or 159 is adjusted to enable this condition.

Figure 2A:
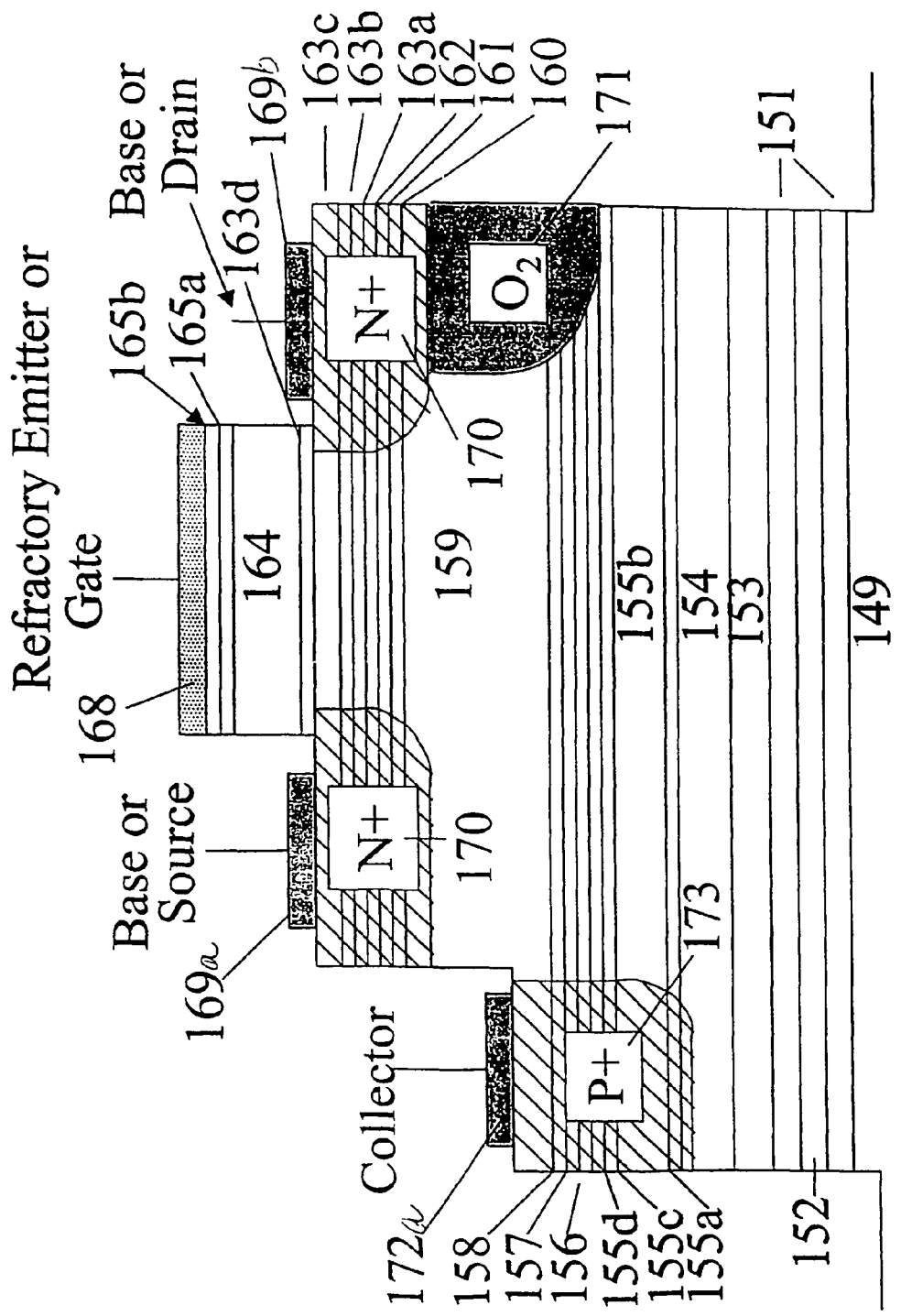
FIG. 2a shows the schematic cross-section of the n type transistor with source, drain and gate contacts and in addition a back gate which is labeled as a collector. The drain is created as a low capacitance, high speed node by the insertion of an oxygen implant to minimize the local capacitance. This is also the cross-section of the p type bipolar device (n channel BICFET) in which the terminal designations are emitter, base/source, and collector which is shown optimized in FIG. 2b.

Using the structure as set forth, bipolar and field-effect transistors and optoelectronic devices in the form of thyristors and transistors can be made in accordance with a generalized set of fabrication steps. The first structure shown in FIG. 2a is the N channel HFET (NHFET). As the figure shows it is formed with a refractory metal gate contact 168 (the electrode is also labeled as an emitter because the same set of contacts may be used to operate the structure as a bipolar device which is shown more optimally in FIGS. 2b and 2c). Device fabrication begins with the deposition of the refractory gate which is followed by an ion implant 170 of N type ions to form self-aligned contacts to the channel consisting of the layers 161 and 160. On the source side of the FET, the structure is etched down to near (about 1000 Å above) the p type quantum wells 157 and an ion implant 173 of P type ions is performed to contact the p type inversion channel. Also an insulating implant 171 such as oxygen is performed under the N type drain implant to reduce the capacitance for high speed operation. Next the device is subjected to a rapid thermal anneal (RTA) of the order of 900° C. or greater to activate all implants. Then the device is isolated from other devices by an etch down to the semiinsulating substrate which includes an etch through the mirror pairs 151/152 of AlAs/GaAs. At this point, the device is oxidized in a steam ambient to create layers of AlO/GaAs to perform as the final DBR mirror. During this oxidation step, the exposed sidewalls of the etched AlGaAs layers are passivated by the formation of very thin layers of oxide. The final step in the fabrication is the deposition of Au metal contacts. These contacts come in three forms. One is the AuGe/Ni/Au contact 169 (169a, 169b) for the N+ type implants, one is the AuZn/Cr/Au contact 172 (172a) for the P+ type implant and the third is a final layer of pure Au (not shown) to form interconnect between device nodes.

Figure 2B:
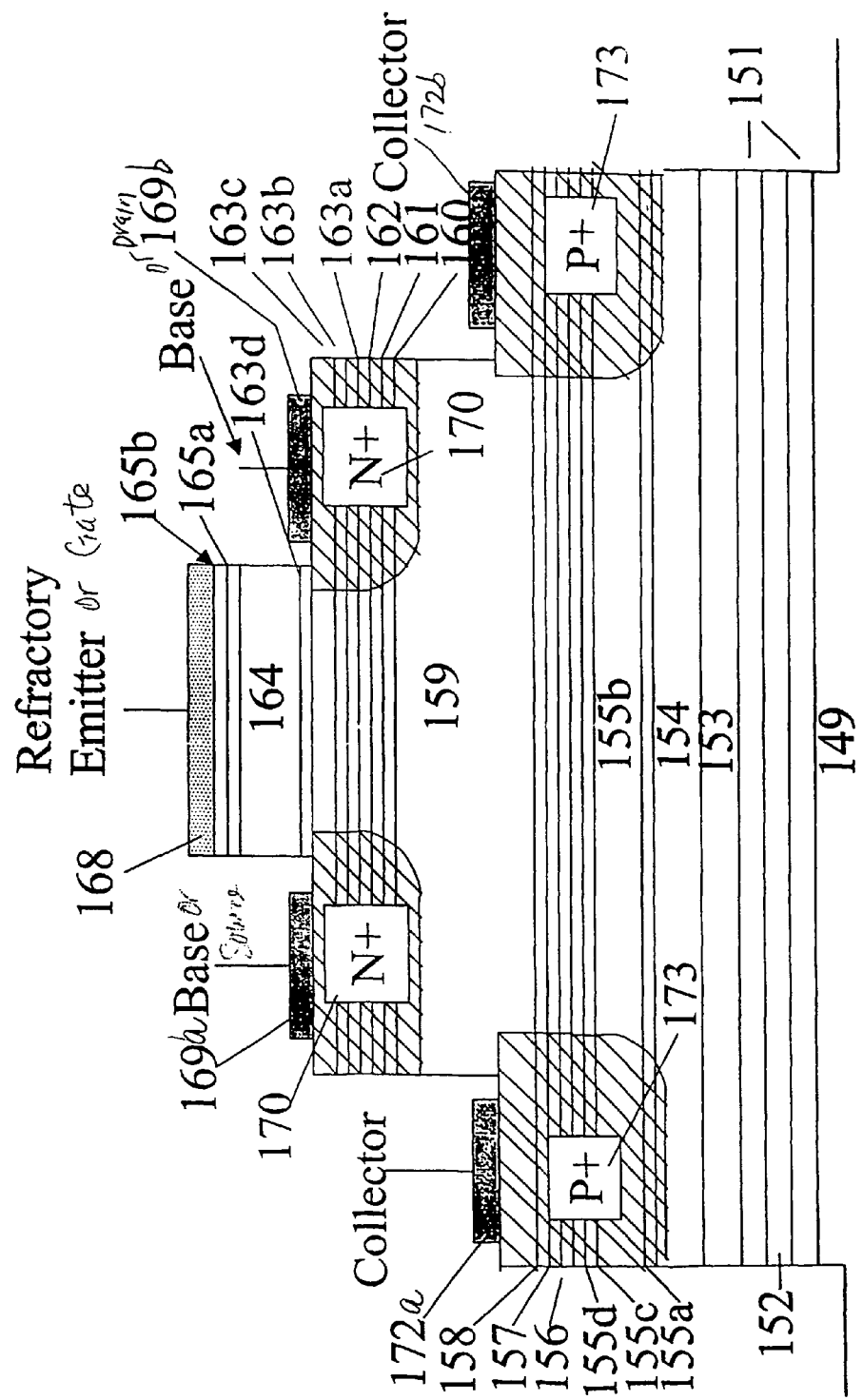
FIG. 2b shows the device contact geometry of the pδnp transistor. In this layout, the base/source terminal contacts the channel from both sides and the collector contact is defined outside of the base contact. In this case, the base resistance is minimized at the expense of collector resistance which includes the unmodulated p channel below the base contact regions.

A second structure is shown in FIG. 2b in which the same fabrication steps have been used, but the configuration has been more appropriately optimized as a bipolar device. To achieve this, after the formation of the refractory contact 168 which is functioning as an emitter, both of the self-aligned implants 170 which contact the channel are connected as base or control electrodes and have the function of controlling the level of charge in the inversion channel. The channel charge controls the thermionic current flow between the emitter and collector producing a thermionic bipolar device. The device is then etched to the collector mesa which is established about 1000 Å above the p type quantum wells 157 and these wells are contacted by a P+ type ion implant, 173. The remainder of the process is the same as in FIG. 2a. It is noted that this bipolar is a pδnp device which would be grown with an inversion channel which is normally on. In terms of bipolar devices, the p type bipolar is always inferior to the n type bipolar and therefore the main application for this device is as the p type component in a complementary bipolar technology.

Figure 2C:
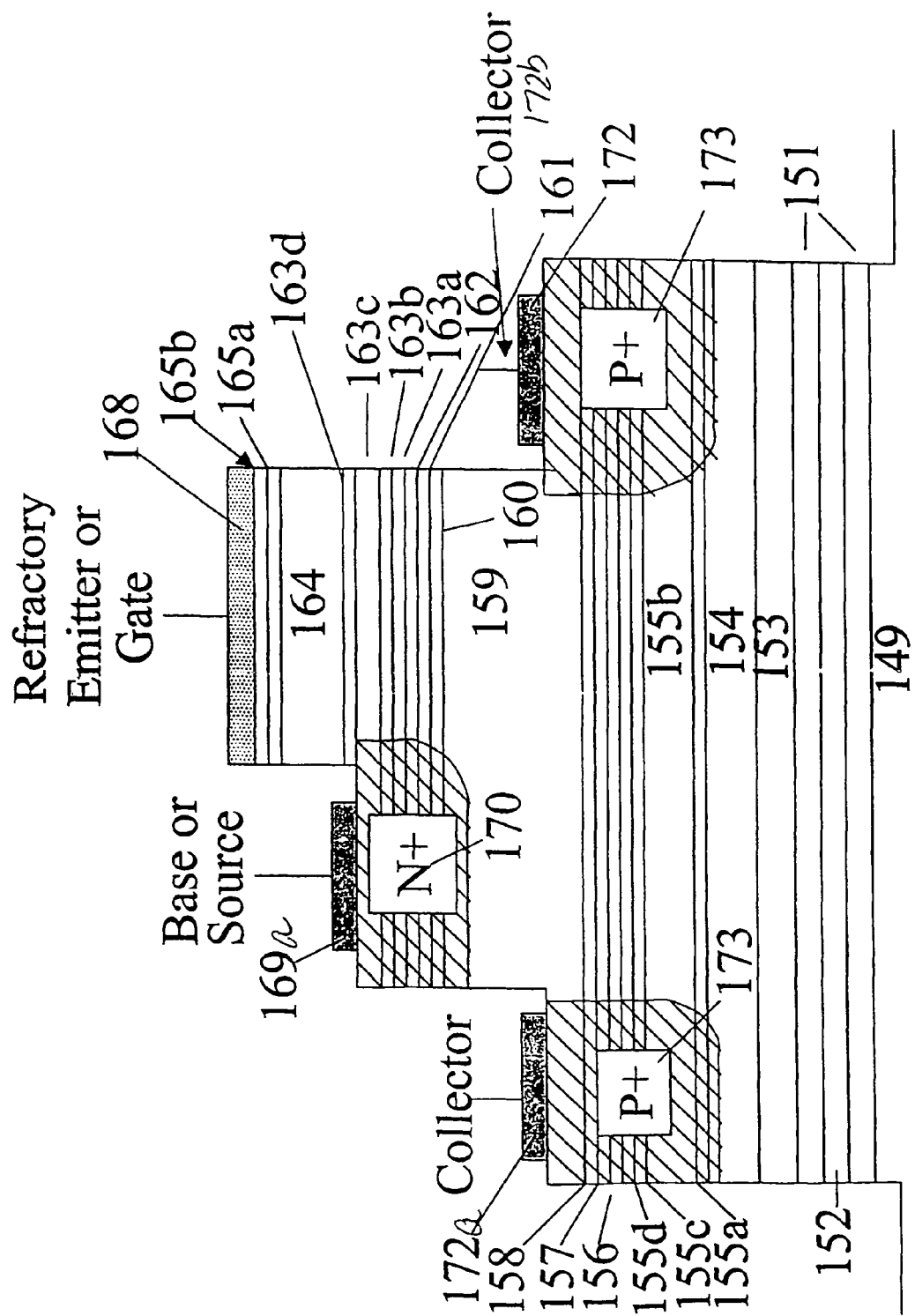
FIG. 2c shows the device contact geometry of the pδnp transistor optimized for lower collector resistance. The base/source contact is self-aligned to one side of the channel and the collector contact is self-aligned to the other side. By comparison to FIG. 2b to the base/source access resistance is higher but the collector access resistance is lower.

It is noted in FIG. 2b, that since both collectors 172a, 172b are outside of the base or source contacts, the collector access resistance is forfeited for the sake of channel or base access resistance. The device can be constructed differently as shown in FIG. 2c, by creating the source contact 169a by self-alignment of implant 170 to one side of the emitter contact 168 and the collector contact 172b by self-alignment of implant 173 to the other side of the emitter contact. The fabrication sequence therefore requires alignment of the mask within the emitter gate feature 168, which limits how small the feature can be made. In the interests of higher speed, a tradeoff is therefore made. With this construction, the collector resistance has been optimized at the expense of the overall source resistance.

Figure 2D:
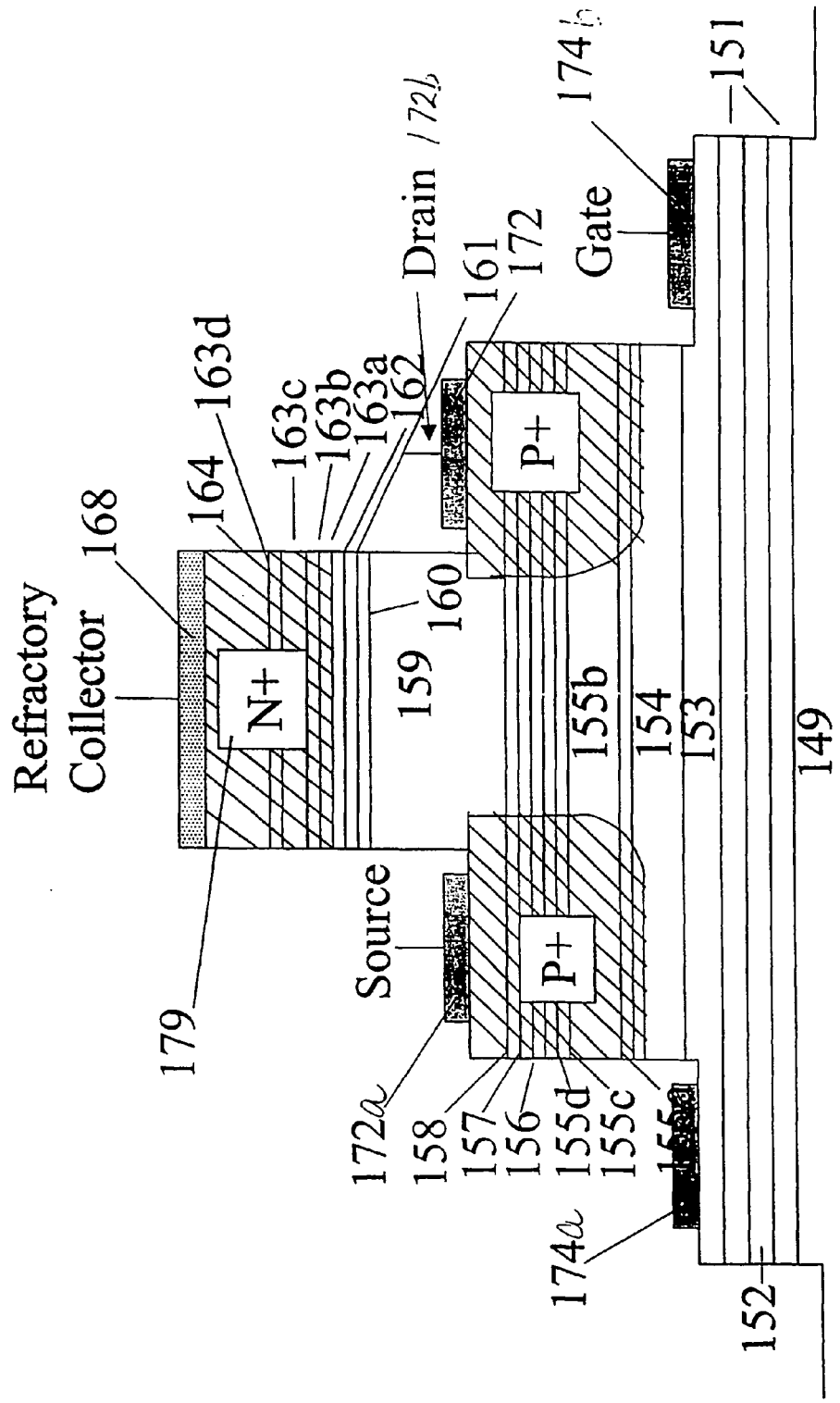
FIGS. 2d, 2e, and 2f show the construction of the PHFET which is also the construction of the nδpn transistor. The p+ layer for an ohmic contact at the top of the structure and the p+ layer which defines the upper plate of the capacitor of the n channel device are both etched away so the modulation doping is exposed prior to deposition of the refractory electrode. For the bipolar transistor, the emitter contacts are required on both sides of the mesa. For the FET, a gate contact on one side of the mesa will suffice.
Figure 2E:
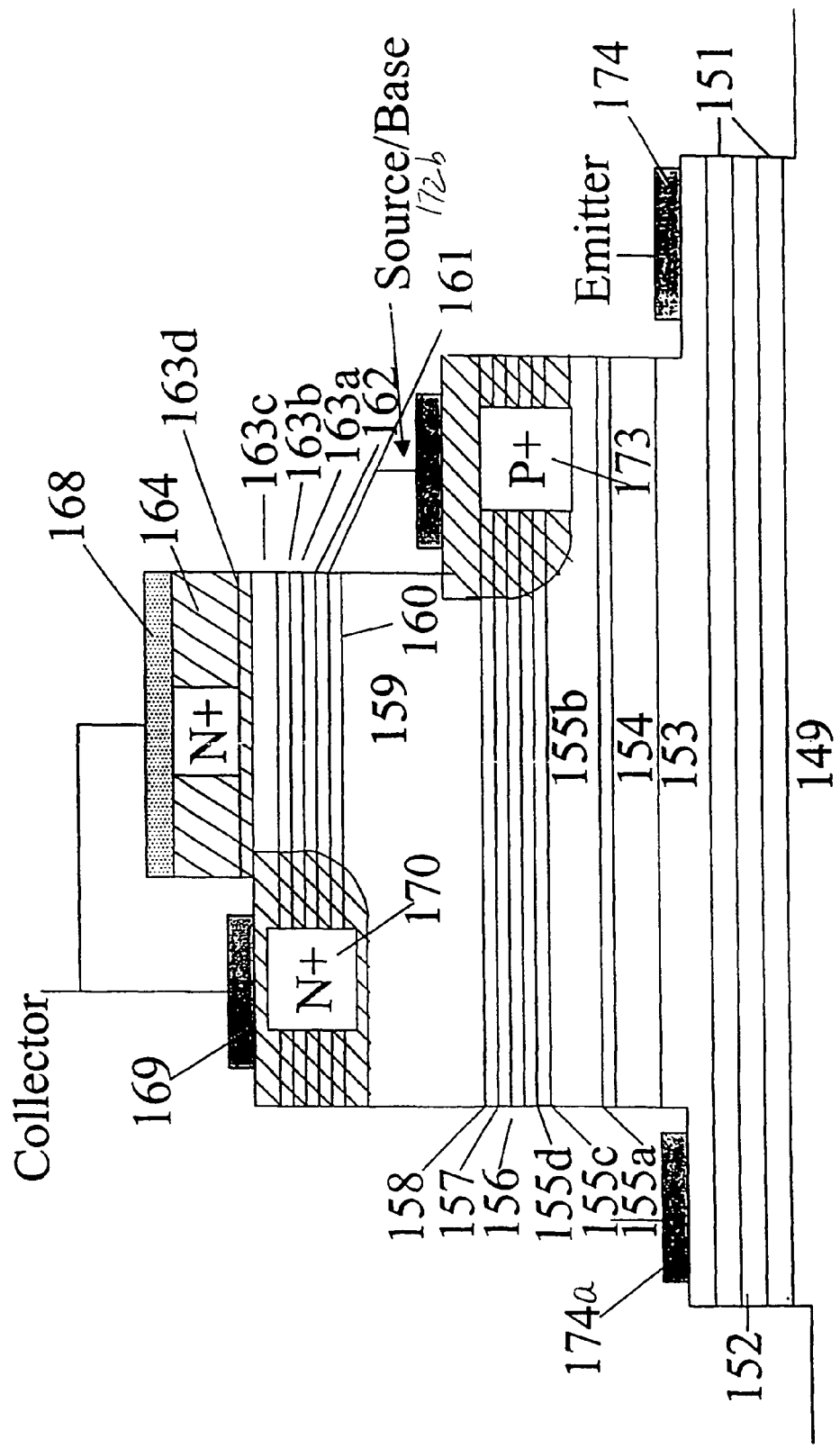
Figure 2F:
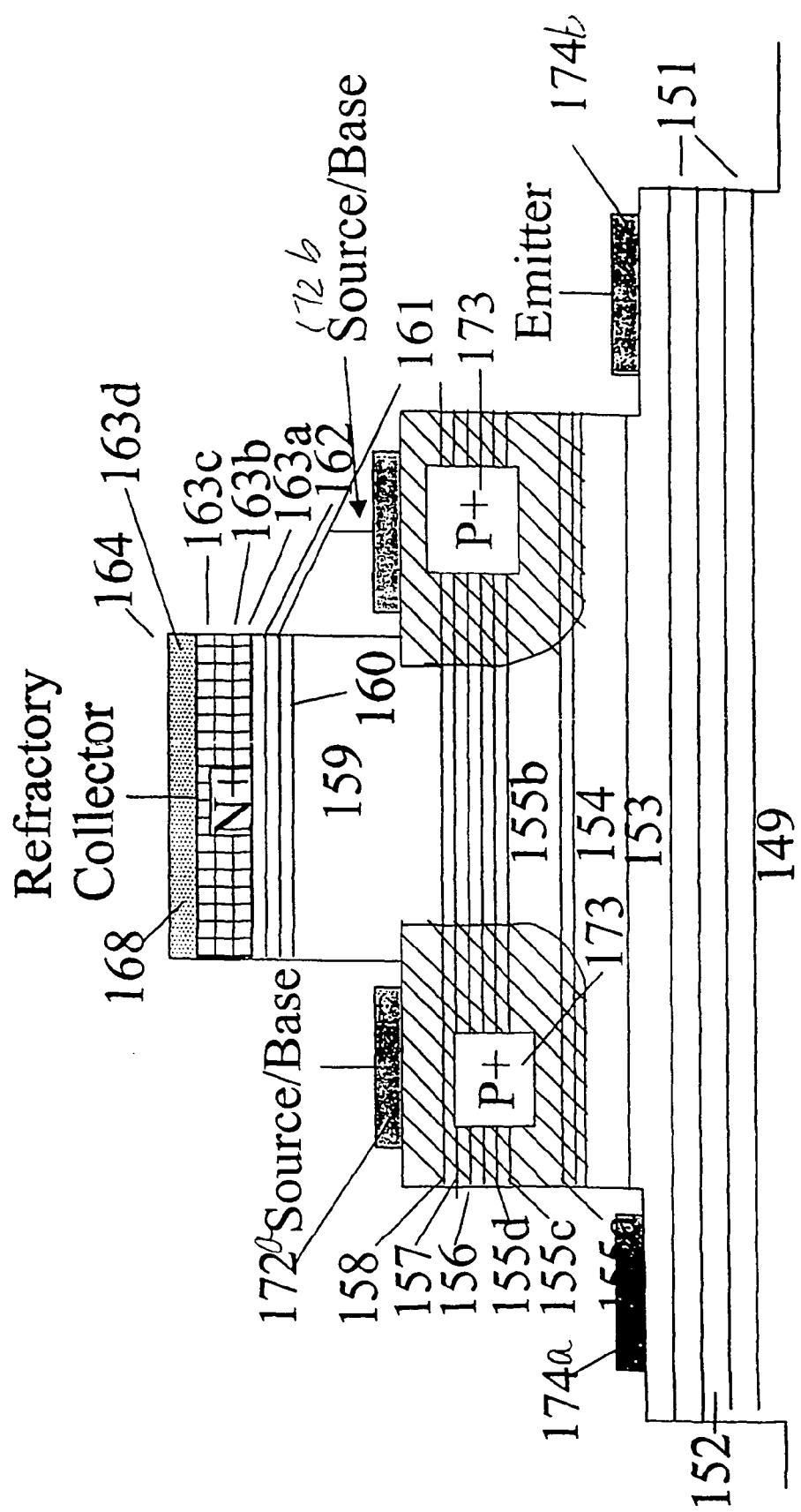

In FIGS. 2d-2f, the cross-section is shown of the PHFET which is identical in cross-section to the nδpn bipolar device. FIG. 2d shows that the top p+ layer 165 is etched away and a N+ implant 179 is used before the refractory metal 168 is deposited in order to create a N contact to the collector region 159 of either the PHFET or the nδpn bipolar device. Using the refractory contact 168 as a mask, the semiconductor is etched to within 100 Å of the p quantum wells and then the P+ type implant 173 is performed to create self-aligned contacts to the p inversion channel 157/158. It is noted that the P+ type implant can be made deep enough to penetrate through to the SI substrate below which has the benefits of low capacitance for both bipolar and HFET high speed circuit operation. Then a RTA step is performed to activate all implants. Then a mesa is formed and the layers are etched down to the N+ layer 153 that forms the underlying gate electrode. Next, a larger mesa is etched down through the mirror layers to isolate all devices and the oxidation step is performed which creates mirrors under devices and passivates all device sidewalls. The final step is the deposition of p type Au alloy metals 172 to the P+ type implants and the deposition of n type Au alloy metals 174 to the N+ gate layer.

In FIG. 2e, the collector contact resistance is improved by making a self-aligned contact to the n type quantum well channel 161/160 by implantation using the refractory metal as a mask but implanting only on one side of the feature. On the other side of the refractory contact, the semiconductor is etched down to 1000 Å from the p type quantum wells 157/158 and a P+ type implant 173 is performed which creates the base or source contact for the nδpn transistor by accessing the p type inversion channel (as in FIG. 2d this implant may penetrate through to the SI substrate). This type of construction requires a larger gate/emitter feature 168 than the one in FIG. 2d because an alignment is required in the center of the feature. After the RTA step to activate the implants, a larger mesa is formed to create the emitter contacts 174a, 174b to the N+ bottom layer 153, device isolation is formed as in FIG. 2d and also the Au contact metallurgy. With this type of construction, the collector contact resistance is reduced at the expense of the base (source) access resistance. Therefore, in an attempt to achieve higher speed, higher base access resistance is tolerated in order to achieve lower collector access resistance.

In FIG. 2f, the device cross-section of another approach to obtain low collector access resistance is shown which is potentially superior to FIGS. 2e and 2d. In this case, the material is initially etched to remove layers 165, 164 and 163d. By doing this etch, all of the P+ type layers are removed prior to the deposition of the refractory contact. By deposition of a W/In contact metallurgy and the use of the RTA step, a small amount of alloying occurs which is sufficient to cause the W/In to interact with the N+ charge sheet layer, 163b. Using this approach requires extremely tight control of the semiconductor etch to enable precise etching and removal of the P+ charge layer. This approach is enabled by the novel epitaxial growth introduced here. The epitaxial growth has been designed to concentrate all of the p type barrier charge into a thin sheet spaced away from the n type modulation doping. By separating the two charge sheets in this fashion, it is possible to etch to the position between them and thus effectively remove all of the p type doping layers from the top of the device. If this approach can be implemented effectively, it is the optimum approach because it may minimize the collector resistance and the base resistance together and, at the same time the collector capacitance. Once the refractory gate 168 has been defined and etched, the fabrication follows that described for FIG. 2d.

It should be noted that the various structures of FIGS. 2a-2f (as well as the structures of FIGS. 2g-2j discussed hereinafter) can be formed adjacent each other (e.g., on separate mesas) and interconnected as desired. Thus, for example, the NHFET structure of FIG. 2a and PHFET structure of FIG. 2d can be interconnected to form complementary FET circuits where the gate terminal 168 of FIG. 2a is coupled to the gate terminal 174a or 174b of FIG. 2d, the drain 169b of FIG. 2a is coupled to the drain 172b of FIG. 2d, the NHFET source 169a of FIG. 2a is coupled to ground, and the PHFET source 172a of FIG. 2d is connected to a positive supply voltage. It should also be appreciated that mesas are formed by etching down to desired layers. Thus, depending upon the electrical and thermal isolation characteristics desired, a mesa can be formed, e.g., by etching down to the top mirror layer 152, or even deeper down to the substrate layer 149.

Figure 2G:
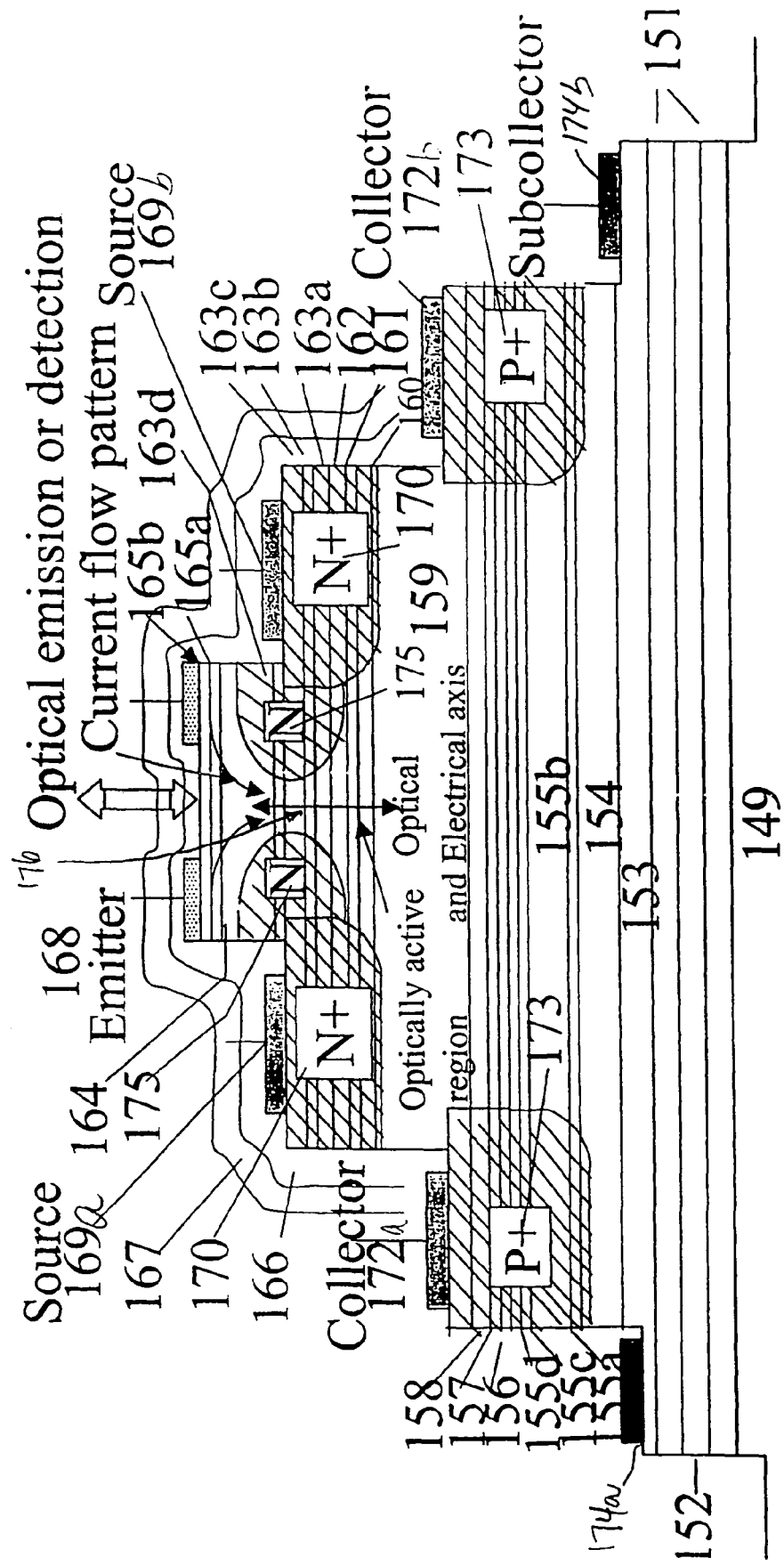
FIG. 2g shows the generalized construction of the optoelectronic thyristor structure configured as a vertically emitting or detecting device. Both n channel and p channel contacts are shown for completeness. The optical aperture is formed by N type implants which are placed inside of the metal tungsten emitter contact. The current flow into the active layer is guided by the implants as shown. The bottom mirror is grown and converted to AlO/GaAs and the top mirror is comprised of deposited layers.
Figure 2H:
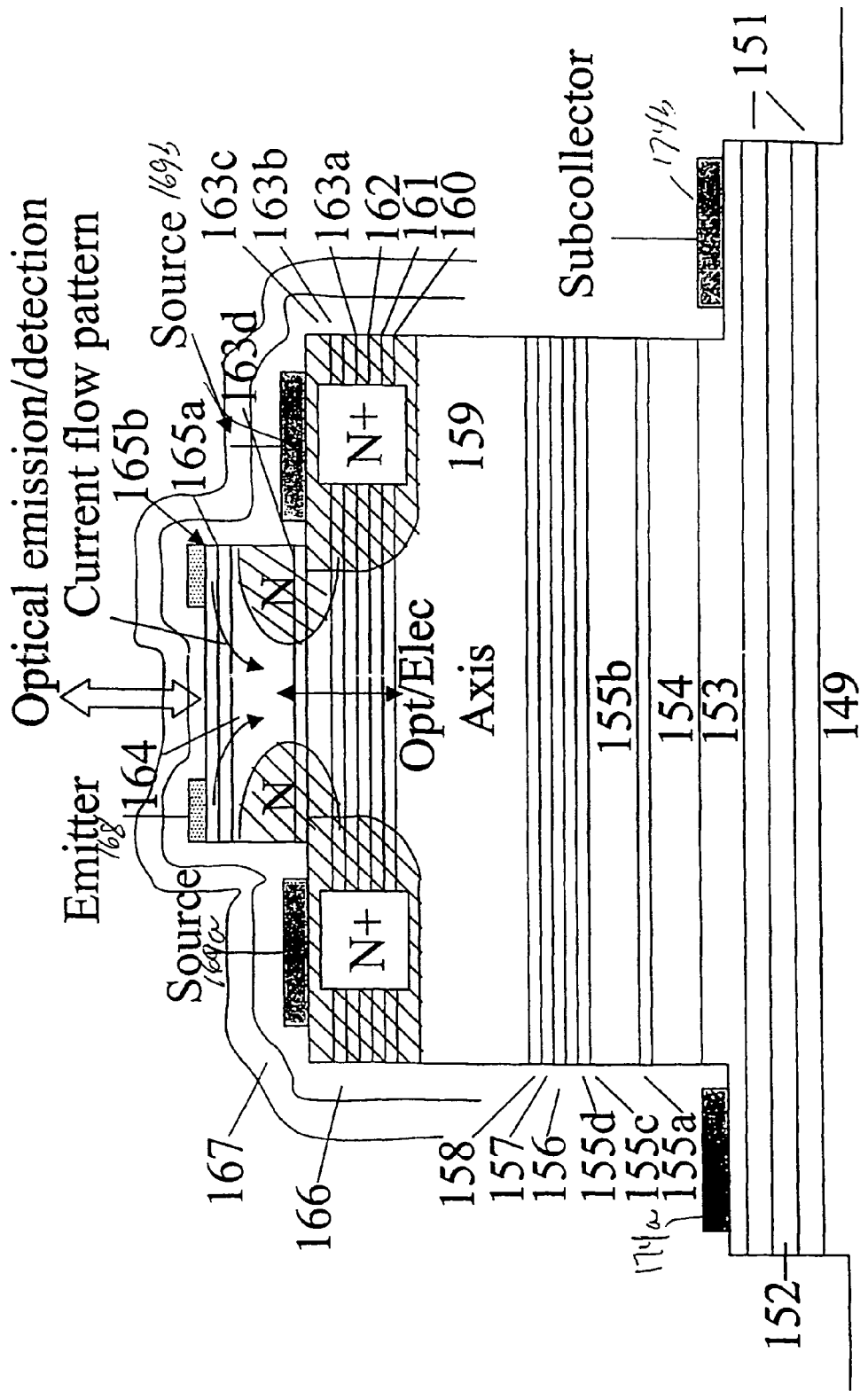
FIG. 2h shows the optoelectronic thyristor structure formed with only the electron channel contact as the third terminal input. This is the most practical thyristor structure as only a single high impedance input node is required to change stage and the electron channel is preferable due to its higher mobility.

In FIGS. 2g-2j, the fabrication sequences previously described are adapted to the formation of optically emitting, detecting, modulating and amplifying devices. FIG. 2g shows the device cross-section of the thyristor device with N+ ion implants 170 used to form self-aligned channel contacts to the n type inversion channel and P+ ion implants 173 used to form self-aligned channel contacts to the p type inversion channel. These channel injectors enable switching of the thyristor with n type and/or p type high impedance third terminal inputs. These implants are formed using the identical fabrication steps as just described in FIGS. 2a-2f. The subcollector or backgate connection is also created by etching to the N+ bottom layer 153 and applying the AuGe/Ni/Au ohmic ally contact 174 (174a, 174b) and the p type and n type implants 173/170 are contacted by p type and n type Au alloy metals (172 and 169) respectively as described previously. The key difference for the optical devices is in the formation of the emitter contact. The device fabrication begins with the definition of alignment marks (not shown) by etching and then the deposition of a layer of $Si_3N_4$ (not shown) to act as protection for the surface layer and as a blocking layer for subsequent ion implants. Then an ion implant 175 of N type ions is performed using a photomask that is aligned to the alignments marks, and produces an optical aperture 176 defined by the separation between the implants. The implants create a p-n junction in the layers between the n type quantum wells and the surface and the space between the implants defines the region in which the current may flow and therefore the optically active region. The current cannot flow into the n implanted regions 175 because of the barrier to current injection. The current flow trajectory is shown in the Figure. The laser threshold condition is reached before the voltage for turn-on of this barrier. Following the implant, the refractory gate 168 is deposited and defined as an annulus which is also aligned to the alignment marks and therefore to the implant. The metal etching stops on the nitride inside the annulus and on the semiconductor outside the annulus. The rest of the fabrication follows the descriptions above until after all metal interconnects have been defined. To form resonant cavity devices, a dielectric mirror is deposited on this structure during the fabrication process. The distance between the mirrors is the thickness of all layers from 153 to 165 inclusive. In designing this structure, this thickness preferably represents an integral number of ¼ wavelengths at the designated wavelength and the thickness of layer 164 and/or 159 is adjusted to enable this condition. Then a dielectric mirror is created on the top of the device by the deposition of dielectric layers 166 and 167, typically layers of $SiO_2$ and a high refractive index material such as GaAs or GaN. The dielectric mirror serves two purposes. It defines a cavity for the vertical emission and absorption of light and it serves as the cladding layer for a waveguide so that light may propagate in the plane of the wafer. For most applications, only the electron third terminal 169 (169a, 169b) and not the hole third terminal 172 (172a, 172b) will be used. A cross-section of a device without the hole terminals 172 is shown in FIG. 2h with the device operating as a vertical cavity emitter or detector.

Figure 3A:
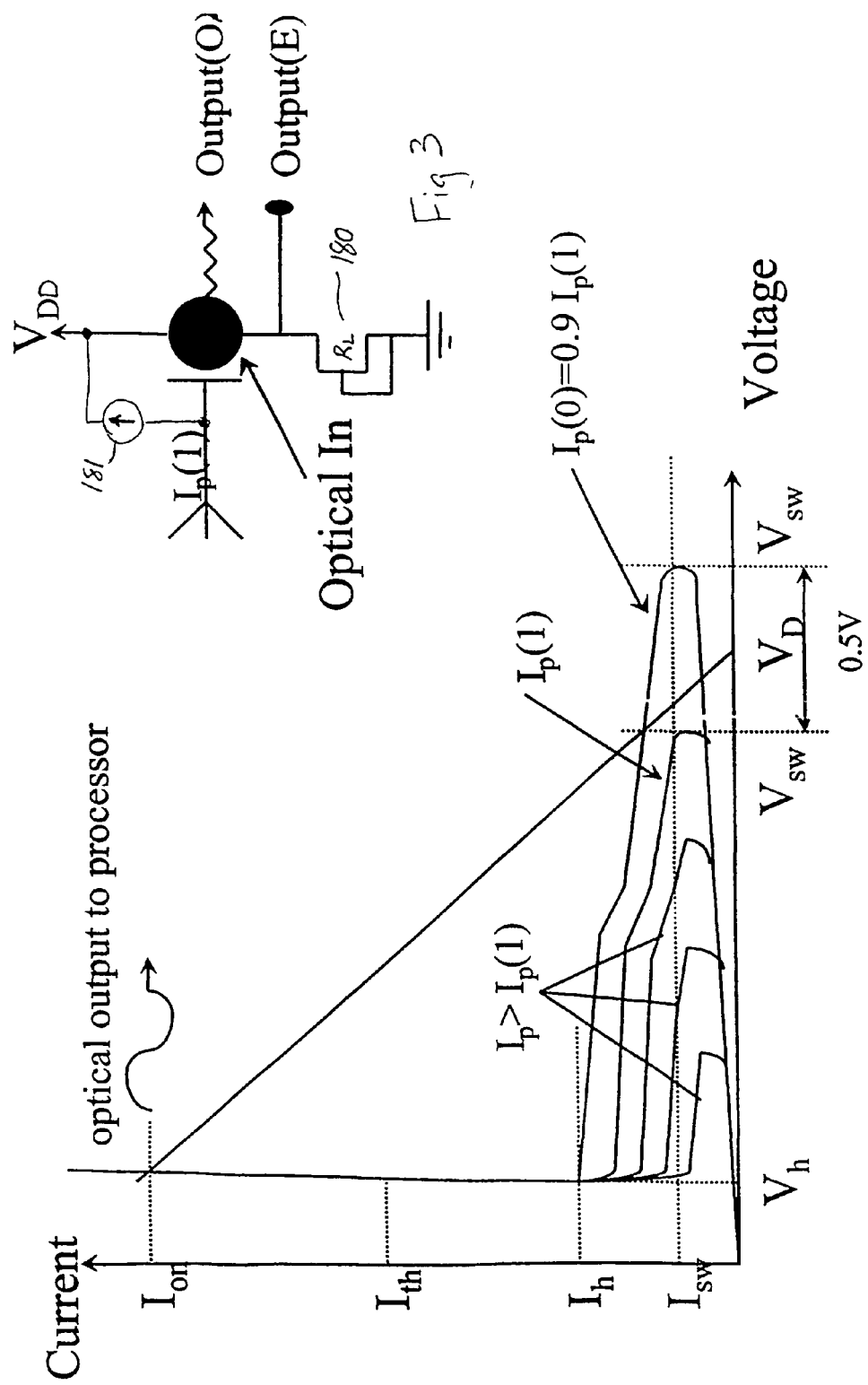
FIG. 3a shows the circuit configuration of the thyristor with a series load element which is a transistor integrated with the thyristor in the form of an HFET or a bipolar device. The third electrical terminal provides a high impedance input to trigger the device. The IV characteristics of the device are also shown and switching occurs when the switching voltage has been reduced below the biasing voltage.

Returning to FIG. 2g, as an optoelectronic component, this device is multifunctional. If the source 169 is biased positively or the collector 172 is biased negatively, then the thyristor will switch to its on state and if the biasing is above the threshold for lasing, then laser emission will be obtained through the optical aperture at the top surface of the device. This is the operation of a vertical cavity laser. If the thyristor is in the off state and light is admitted through the top optical aperture, then the device functions as a digital detector in the sense that when sufficient electron-hole pairs have been generated to achieve the critical switching condition, then switching to the on state will occur. The configuration for an optical receiver is shown in FIG. 3. Suppose the device is biased to its supply voltage $V_{DD}$ through a load resistor $R_L$, 180. Suppose also that the N+ electron source terminal 169 (designated the injector) is biased to the most positive voltage $V_{DD}$ through a current source, 181. When light is incident on the detector of sufficient intensity to produce photocurrent in excess of the current source drawing on the injector terminal, the thyristor will switch on. When the incident light is reduced, the thyristor will switch off because the current source on the injector drains the channel of charge. Therefore this circuit functions as an optical receiver.

Figure 2I:
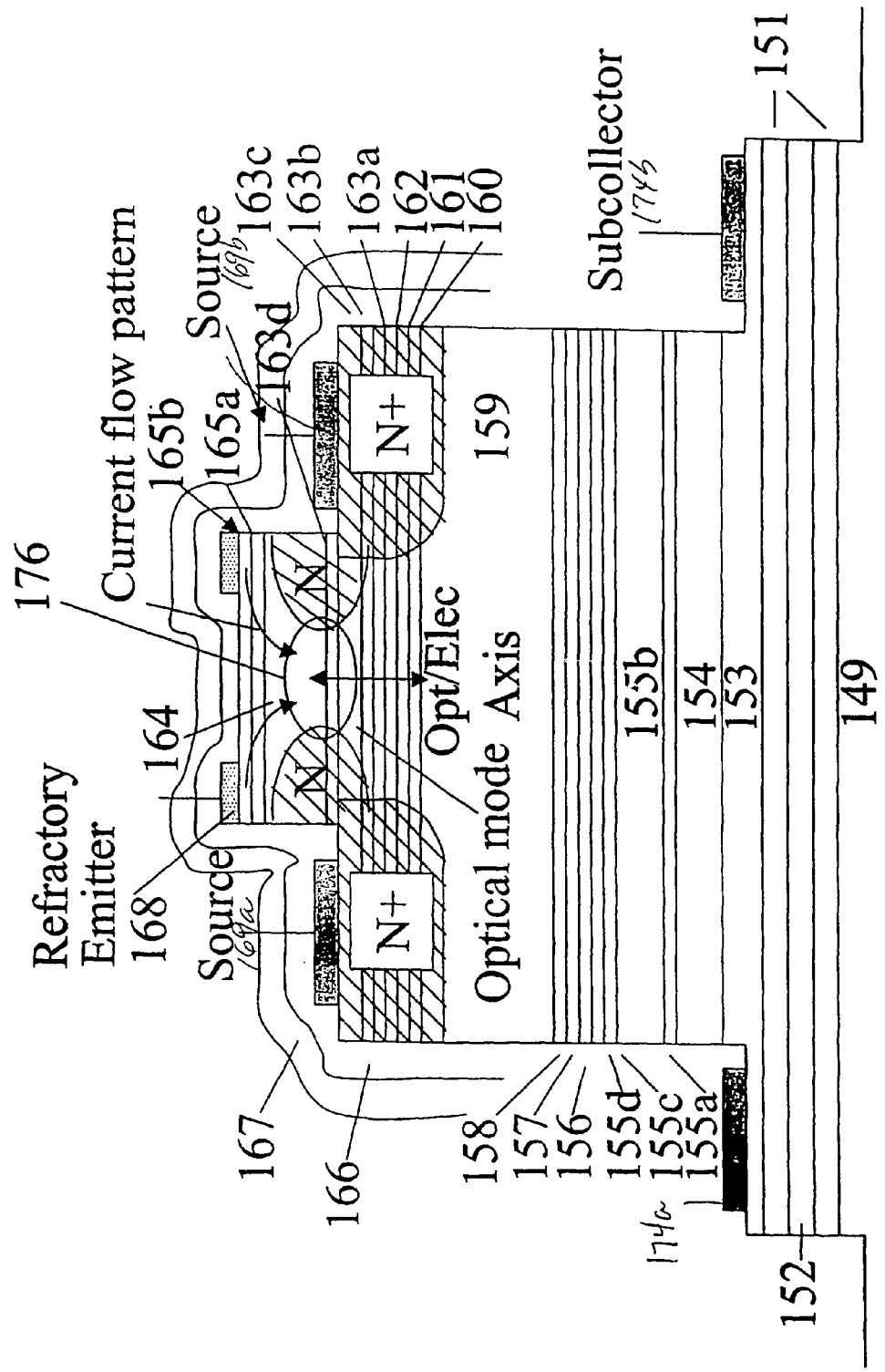
FIG. 2i shows the optoelectronic thyristor structure formed with the electron third terminal input and adapted to the waveguide propagation of signals. The light is confined to an optical mode as shown by the cladding formed on the top by the deposited DBR mirror and by the cladding formed on the bottom by the grown DBR mirror. For the laser structure, the light is converted from a vertically propagating mode to a waveguide propagating mode by the action of a second order diffraction grating formed in the first mirror layer of the top deposited mirror. The waveguide device also performs as a thyristor digital receiver, as a waveguide amplifier and as a waveguide digital modulator.
Figure 3B:
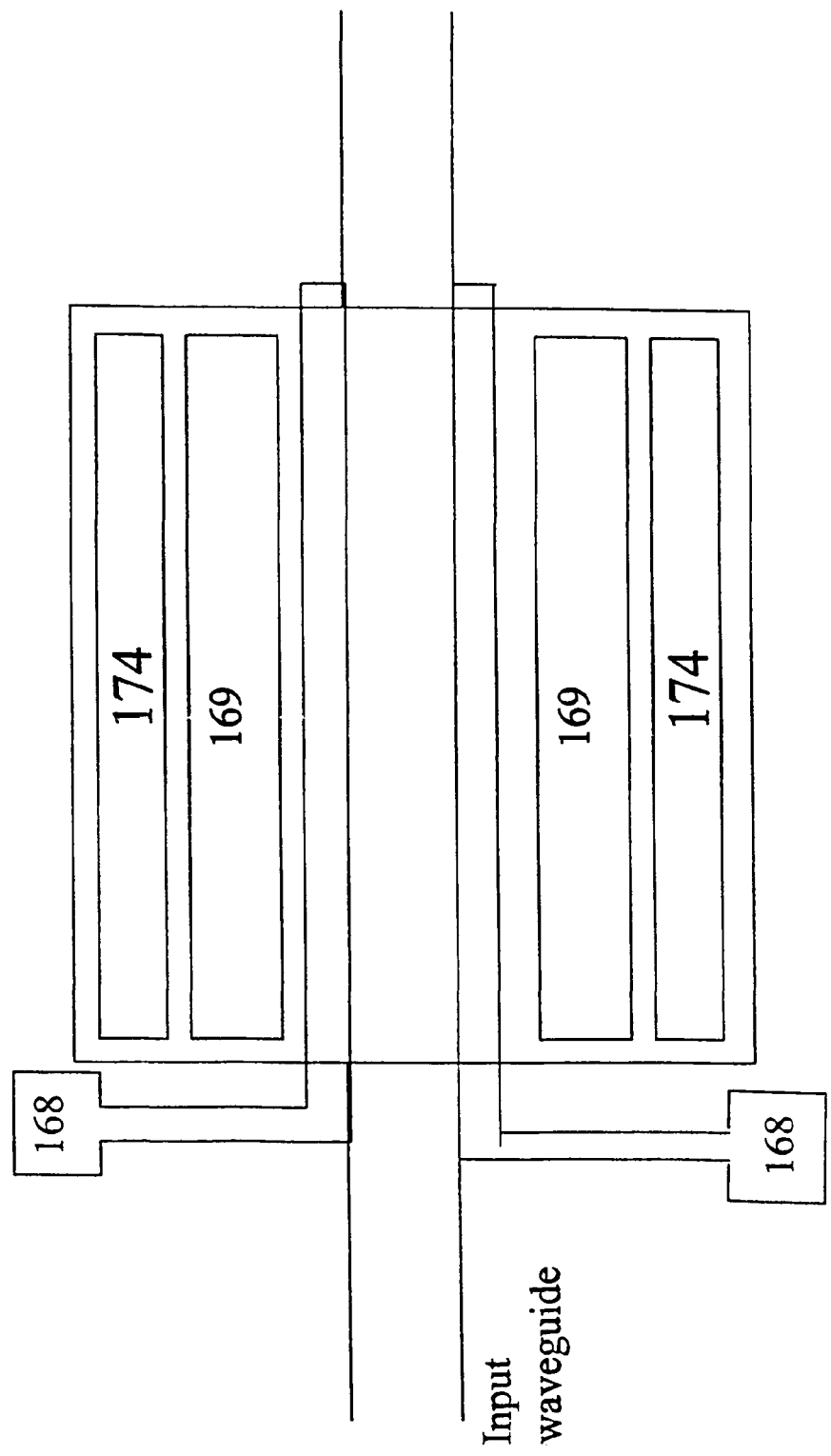
FIG. 3b shows the top view of the in-plane configuration of the single waveguide device. The light propagates in the waveguide formed by the quantum wells as a core region and the dielectric mirrors as the waveguide cladding regions. The light enters from a passive waveguide and exits to a passive waveguide. These passive waveguides have near zero reflectivity at the transition to the active waveguide. The active device may have a grating defined in the first layer of the upper dielectric mirror to enable conversion from a laterally propagating to a vertically propagating mode.
Figure 3C:
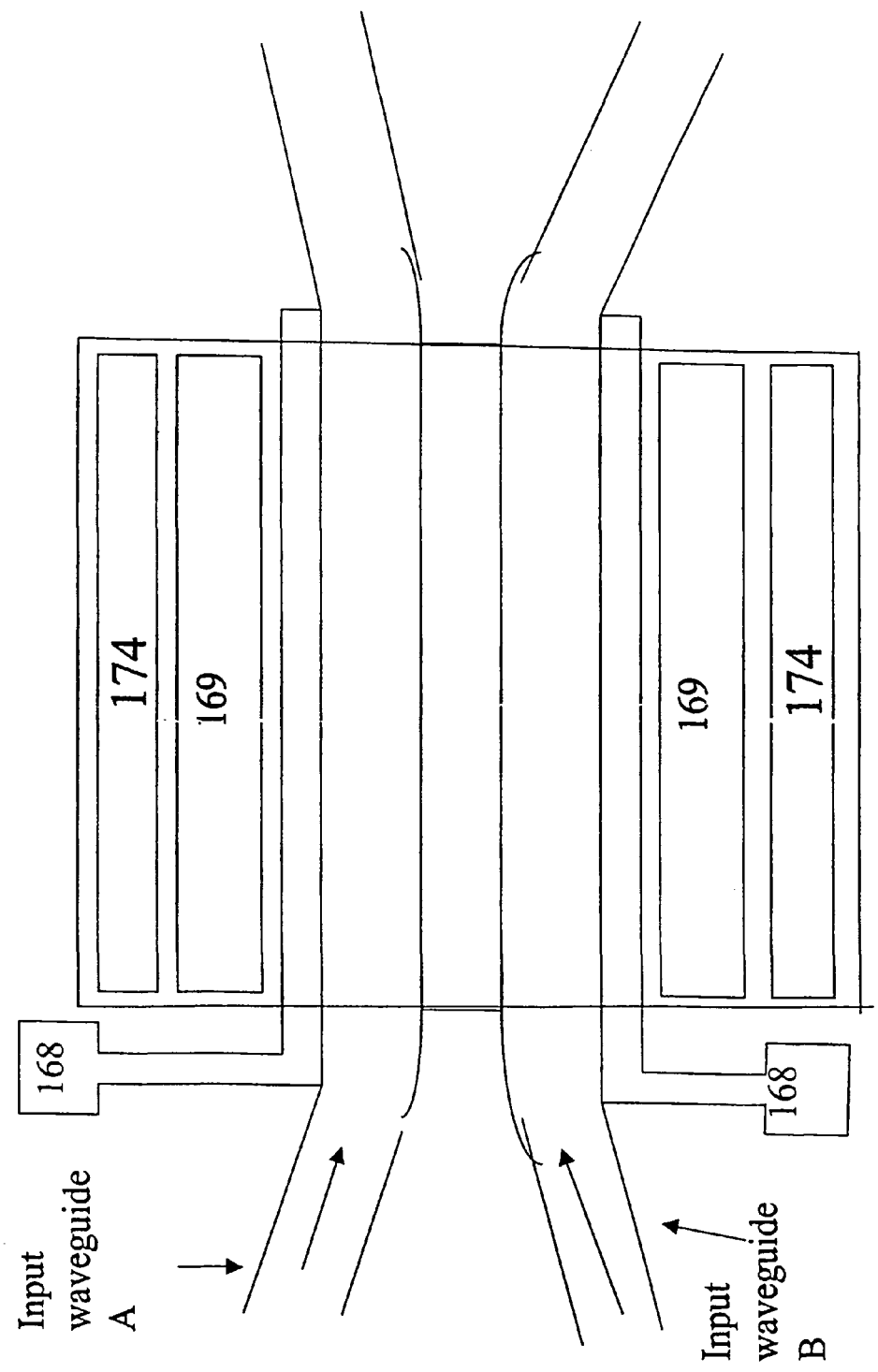
FIG. 3c shows a top view of the directional coupler optical switch. Two active waveguide channels are separated by an electrically isolating region which evanescently couples waves between the two guides. Other aspects of the guides are identical to FIG. 3b.

The device shown in FIG. 2h may also function as an in-plane or waveguide device if a grating is formed in the upper mirror layer 166, 167 according to the techniques discussed in U.S. Pat. No. 6,031,243 to Taylor, which is hereby incorporated by reference herein in its entirety. The grating performs the function of diffracting the light produced by the vertical cavity into light propagating in a waveguide which has the upper (166, 167) and lower (151, 152) mirror layers as waveguide cladding layers and the implants 170 as lateral confinement regions. This kind of operation is shown in FIG. 2i. A plan view of this device showing how the passive waveguides connect to the active waveguides is shown in FIG. 3b. This device has the modes of operation of a laser, a detector, a modulator and an amplifier. As a laser, all light generated within the vertical cavity is directed laterally into the waveguide formed by the mirrors and is then connected to a passive waveguide at the edge of the device. As a waveguide detector, the light is entered into the device from a passive waveguide, is diffracted into the vertical cavity mode and is absorbed resonantly in the vertical cavity. In this manner of operation, the device would be biased electrically as shown in FIG. 3 and the function of the circuit would be that of an optical receiver. However it also noted that if the subcollector contact 174 in FIGS. 2h or 2i is not connected (i.e. it is allowed to float) then the device may operate as a simple pin detector with connections to the gate 168 and to the source 169, since a photocurrent would be produced in the gate/emitter to source circuit and switching would be prohibited. As a waveguide absorption modulator, two forms of operation are possible. First, the device may perform as a digital modulator if the device is biased as a thyristor and the electrical data is entered via the injector. The injector injects current into the device and it switches to the on state if the data is a one. In the switched on state there is no optical loss and an optical "1" is produced. On the other hand, if the data is a zero the injector continuously removes charge (current flows out of the device) and forces the device to remain in the off state. In the off state, all of the optical signal is absorbed and an optical "0" is produced. For this operation, the device may operate either with or without the grating. However, with the use of the grating a shorter length of device is possible. Second, the device may perform as an analog modulator if the subcollector of the device is not connected. As an analog modulator, any level of modulated intensity is obtainable by varying the injector input voltage up to the maximum absorption change of the modulator produced by the maximum voltage for FET conduction without bipolar conduction, since switching may not occur with the subcollector disconnected.

The final mode of operation of the device is as a waveguide amplifier. If the device in FIG. 2i is operated in the switched on state but well below the threshold for lasing, then optical signals input to the device from a passive waveguide at one end may be amplified to a larger optical signal at the output of the device. For the amplifier also, the grating may or may not be used. However, the use of the grating will result in a shorter device. It will also result in the stabilization of the polarization, since the grating supports the TE mode much more strongly than the TM mode.

Figure 2J:
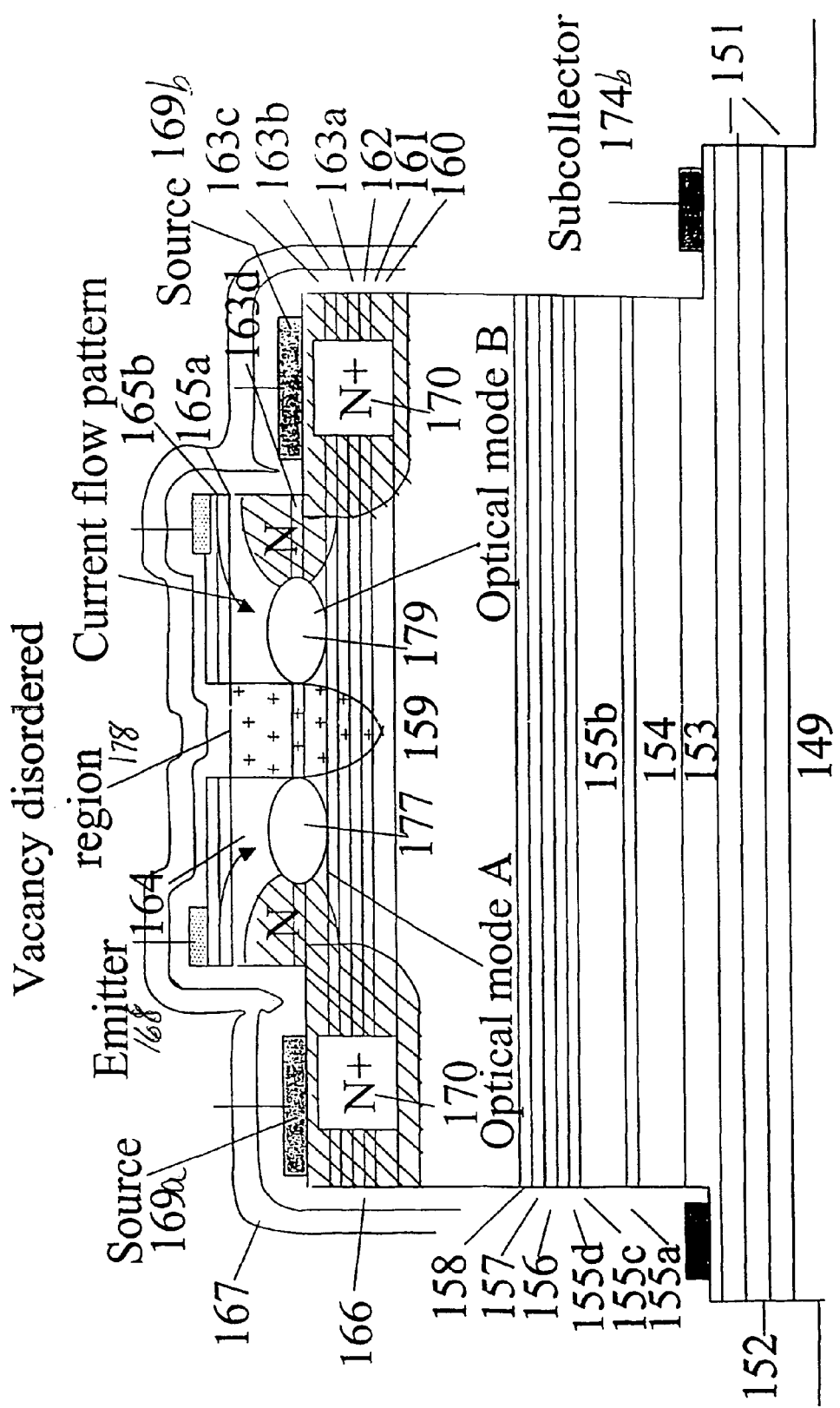
FIG. 2j shows the optoelectronic thyristor waveguide structure with electron third terminal inputs and adapted to the formation of two parallel waveguide channels. The light is coupled from one channel to the other and vice versa by evanescent coupling. The coupling takes place through a region of slightly larger bandgap and therefore slightly lower index created through techniques such as vacancy disordering. The switching in such a directional coupler device occurs by the injection of charge into one of the two channels.

All of the modes of operation discussed thus far have involved only one active waveguide connected to one passive waveguide on the input to the device and another passive waveguide on the output of the device. A particularly significant innovation is obtained if two of the modulator waveguides are brought into close proximity in the lateral dimension such that the guided light in one waveguide evanescently couples to the guided light in the second waveguide and vice versa. A cross-section of this device is shown in FIG. 2j which shows the optical modes 177 and 179 propagating in the two waveguides. The fabrication is identical to that of the single modulator device except that prior to the rapid thermal anneal (RTA), the nitride layer that protects the optical opening is patterned to create an opening 178 that evenly divides the total optically active area into two waveguide channels. The p+ layers are removed in this opening. Then $SiO_2$ is deposited and during the RTA, vacancy disordering occurs, so that a slightly larger energy gap is created in the region 178. This energy gap provides an ideal region for evanescent coupling to occur. The remainder of the processing follows that of the waveguide devices discussed earlier. This device has two passive waveguide channels as inputs and two passive waveguide channels as output as indicated by the plan view of the device in FIG. 3c. Such a device is called a directional coupler and the switching of light from mode A to mode B in FIG. 2j is induced by a differential change in the waveguide propagation constant between guides A and B. This change is produced by the injection of charge into the inversion channel from the self-aligned channel contact and can be produced by the injection of charge into one or the other of the two channels (but not both). It is noted that the construction technique of the two channels must be such that the two waveguides are identical in all respects so that the coupling length will be constant over a large area. There are different modes of operation which may be considered. In one, the subcollector is biased to ground through a load resistor and the emitters are biased positively. Therefore both waveguide sections are potential switches. Then when current is injected into one side (one of the source regions 169), that side will switch and will result in a filling of the electron channel on that side only (it is noted that when one side switches the other side may not switch because the voltage across the device has been reduced). This will produce a distinct difference in propagation constant between the two waveguides which is ideal for the evanescent coupling. It is noted that once switched to the on state, the gain of the waveguide as an amplifier may be adjusted to offset all other optical losses (such as insertion loss etc.). With the injection of charge, the absorption edge of the quantum wells in the waveguide will be shifted and there will be a wavelength $\lambda_{max}$ corresponding to the maximum change of absorption. According to the Kramers Kronig relations, there will be an increase in refractive index for $\lambda > \lambda_{max}$ and a decrease for $\lambda < \lambda_{max}$. For the through, or unswitched state, it is required for the light to evanescently couple from channel A to channel B and then back to A and vice versa for channel B. Therefore for the through state we require the largest index and would choose the wavelength $\lambda > \lambda_{max}$. This means that in the through state, both channels should be full of charge which corresponds to the switched on state. Hence when operating the directional coupler in the thyristor mode, the on state corresponds to the through state. However, since we know that the thyristor switching can only occur in one of the waveguides, then the charge in the second waveguide is provided by injection in an analog mode without switching. Therefore the desired mode of switching is to switch on one side of the switch and then to present the data for switching to the other side. The cross state (switched state) corresponds to the optical signal on channel A coupling to channel B only once and vice versa for the optical signal on channel B. Suppose the channel A thyristor is switched on. Then the transition from the through state to the cross state occurs when the source input to channel B is injected with charge. When channel B is emptied of charge, the absorption increase is removed in that channel and therefore also the increase in index is removed. This results in the change in propagation constant and therefore in the increase in the coupling length which is associated with the cross state. It is noted that in the through state with charge in both channels. There is optical gain available in both channels. In the cross state, there is optical gain available in one channel. Such gain is useful to offset the insertion loss and losses incurred in traversing the directional coupler. It is noted that in order to take advantage of this gain, the wavelength of the optical mode may need to be adjusted to coincide with the maximum change in the refractive index. This may be accomplished by localized heating of the switch using a dedicated HFET as a heating element.

The passive waveguides interconnecting all devices are also created by the use of the vacancy disordering technique. In the passive waveguide regions, a ridge is etched and is coated with $SiO_2$ so that a non-absorbing (and therefore low loss) region is formed. The passive waveguide is later coated with the upper dielectric mirror layers to provide the upper cladding layers for waveguide propagation.

There has been described and illustrated herein a semiconductor structure which utilizes an inversion channel created by modulation doping to implement thyristors, transistors, optical emitters, optical detectors, optical modulators, optical amplifiers and other opto-electronic devices. While particular embodiments of the invention have been described, it is not intended that the invention be limited thereto, as it is intended that the invention be as broad in scope as the art will allow and that the specification be read likewise. Thus, while particular layers have been described with particular thicknesses and with particular types and strengths of dopings, it will be appreciated that certain transition layers could be removed and/or additional layers and/or sublayers could be utilized, and further that the layers could have different thicknesses and be differently doped. Also, while particular layers have been described with reference to their percentage content of certain constituents, it will be appreciated that the layers could utilize the same constituents with different percentages, or other constituents. Additionally, while particular formation and metallization techniques have been described, it will be appreciated that the described structures can be formed in other manners, and other metals used to form terminals. Further, while particular arrangements of bipolar and FET transistors, optical emitters, detectors, modulators, amplifiers, etc. formed from the described semiconductor structure, and circuits utilizing those components have been described, it will be appreciated that other devices and circuits can be made from the provided structure and components. It will therefore be appreciated by those skilled in the art that yet other modifications could be made to the provided invention without deviating therefrom.

What is claimed is:

1. An optoelectronic integrated circuit comprising:
   a) a substrate;
   b) a resonant cavity formed on said substrate; and
   c) a thyristor device having four regions of changing conductivity type formed in said resonant cavity, the thyristor device receiving an input signal and producing at least one of an output optical signal via laser emission for output outside said resonant cavity and an output electrical signal in response to reception of said input signal;
   wherein said thyristor device comprises i) at least one modulation doped quantum well structure comprising a quantum well, an undoped spacer layer disposed adjacent said quantum well and a relatively thin and doped charge sheet disposed adjacent said spacer layer opposite said quantum well, ii) an anode terminal, iii) a cathode terminal, and iv) an injector terminal operably coupled to said at least one modulation doped quantum well structure.

2. An optoelectronic integrated circuit according to claim 1, wherein:
   said thyristor device produces both said output optical signal and said output electrical signal in response to reception of said input signal.

3. An optoelectronic integrated circuit according to claim 1, wherein:
   said input signal comprises an input optical signal.

4. An optoelectronic integrated circuit according to claim 1, wherein:
   said input signal comprises an input electrical signal.

5. An optoelectronic integrated circuit according to claim 1, wherein:
   said modulation doped quantum well structure defines a channel region operably coupled to a current source that draws current from said channel region via said injector terminal.

6. An optoelectronic integrated circuit according to claim 1, wherein:
   said thyristor device is formed from a multilayer structure of group III-V materials.

7. An optoelectronic integrated circuit according to claim 1, wherein:
   said thyristor device further comprises a p-channel FET transistor formed on said substrate and an n-channel FET transistor formed atop said p-channel FET transistor.

8. An optoelectronic integrated circuit according to claim 7, wherein:
   said p-channel FET transistor comprises a p-type modulation doped quantum well structure, and wherein said n-channel FET transistor comprises an n-type modulation doped quantum well structure.

9. An optoelectronic integrated circuit according to claim 8, wherein:
   said p-channel FET transistor includes a bottom active layer,
   said n-channel FET transistor includes a top active layer, and
   said anode terminal is operably coupled to said top active layer, said cathode terminal is operably coupled to said bottom active layer, and said injector terminal is operably coupled to at least one of said n-type modulation doped quantum well structure and said p-type modulation doped quantum well structure.

10. An optoelectronic integrated circuit according to claim 9, wherein:
    said thyristor device further comprises an ohmic contact layer, a metal layer for said anode terminal that is formed on said ohmic contact layer, and a plurality of p-type layers formed between said ohmic contact layer and said n-type modulation doped quantum well structure.

11. An optoelectronic integrated circuit according to claim 9, wherein:
    said plurality of p-type layers are separated from said n-type modulation doped quantum well structure by undoped spacer material.

12. An optoelectronic integrated circuit according to claim 9, wherein:
    said plurality of p-type layers include a top sheet and bottom sheet of planar doping of highly doped p-material separated by a moderately doped layer of p-material, whereby said top sheet achieves low gate contact resistance and said bottom sheet defines the capacitance of said n-channel FET transistor.

13. An optoelectronic integrated circuit according to claim 9, wherein:
    said thyristor device is configured as an optical detector/modulator by
    i) a current source operably coupled to said injector terminal that draws bias current from said quantum well structure coupled thereto, and
    ii) a load resistor operably coupled to said cathode terminal that biases said thyristor device such that a forward bias exists between said anode and cathode terminals.

14. An optoelectronic integrated circuit according to claim 9, wherein:
    said thyristor device is configured as an optical detector/laser emitter.

15. An optoelectronic integrated circuit according to claim 1, wherein:
    said resonant cavity comprises a bottom distributed bragg reflector mirror and a top distributed bragg reflector mirror.

16. An optoelectronic integrated circuit according to claim 15, wherein:
    an optical aperture in said top distributed bragg reflector mirror injects incident light into said resonant cavity, wherein light produced in said resonant cavity is emitted through said optical aperture.

17. An optoelectronic integrated circuit according to claim 15, further comprising:
    a diffraction grating formed under said top distributed bragg reflector mirror, wherein said diffraction grating injects incident light that is propagating along an in-plane direction into the resonant cavity, and emits light produced in the resonant cavity along an in-plane direction.

18. An optoelectronic integrated circuit according to claim 1 further comprising:
    biasing means for controlling current through said thyristor device when it is switched on.

19. An optoelectronic integrated circuit according to claim 18 wherein:
    said biasing means is integrally formed on said substrate.

20. An optoelectronic integrated circuit according to claim 18 wherein:
    said bias means is adapted such that current through said thyristor device when it is switched on is above threshold for lasing.

21. An optoelectronic integrated circuit according to claim 18, wherein:
    said bias means is adapted such that current through said thyristor device when it is switched on is below threshold for lasing.

22. An optoelectronic integrated circuit according to claim 1 wherein:
    said thyristor device includes at least one intrinsic region, the intrinsic region disposed between a given pair of changing conductivity regions.

23. An optoelectronic integrated circuit according to claim 1 wherein:
    said thyristor device includes
    a bottom n-type region,
    a first intrinsic region disposed above said bottom n-type region,
    an intermediate p-type region disposed above said first intrinsic region,
    a second intrinsic region disposed above said intermediate p-type region,
    an intermediate n-type region disposed above said second intrinsic region,
    a third intrinsic region disposed above said intermediate n-type region, and
    a top p-type region disposed above said third intrinsic region.

* * * * *